(12) United States Patent
Lee

(10) Patent No.: US 8,035,157 B2
(45) Date of Patent: Oct. 11, 2011

(54) HIGH DENSITY FLASH MEMORY DEVICE AND FABRICATING METHOD THEREOF

(75) Inventor: Jong-Ho Lee, Seoul (KR)

(73) Assignee: SNU R&DB Foundation, Seoul (KR)

( * ) Notice: Subject to any disclaimer, the term of this patent is extended or adjusted under 35 U.S.C. 154(b) by 75 days.

(21) Appl. No.: 12/312,717

(22) PCT Filed: Nov. 19, 2007

(86) PCT No.: PCT/KR2007/005801
§ 371 (c)(1),
(2), (4) Date: May 22, 2009

(87) PCT Pub. No.: WO2008/062974
PCT Pub. Date: May 29, 2008

(65) Prior Publication Data
US 2010/0052043 A1    Mar. 4, 2010

(30) Foreign Application Priority Data

Nov. 25, 2006  (KR) .................. 10-2006-0117296

(51) Int. Cl.
*H01L 29/792* (2006.01)
(52) U.S. Cl. .. 257/324; 257/325; 257/326; 257/E29.309
(58) Field of Classification Search .......... 257/324–326, 257/E29.309
See application file for complete search history.

(56) References Cited

U.S. PATENT DOCUMENTS

| | | | |
|---|---|---|---|
| 6,768,158 B2 | 7/2004 | Lee et al. | |
| 7,005,700 B2 | 2/2006 | Lee | |
| 2005/0019993 A1* | 1/2005 | Lee et al. | 438/157 |
| 2005/0242391 A1 | 11/2005 | She | |
| 2006/0141706 A1* | 6/2006 | Hong | 438/257 |

FOREIGN PATENT DOCUMENTS

| | | |
|---|---|---|
| KR | 1020030065864 A | 8/2003 |
| KR | 1020040074501 A | 8/2004 |
| KR | 1020060078437 A | 7/2006 |

OTHER PUBLICATIONS

Park, et al., "A 64-Cell NAND Flash Memory with Asymmetric S/D Structure for Sub-40nm Technology and Beyond," 2006 Symposium on VLSI Technology Digest of Technical Papers, 2006, IEEE.
Sim, et al., "Fully 3-Diemnsional NOR Flash Cell with Recessed Channel and Cylindrical Floating Gate—A Scaling Direction for 65nm and Beyond," 2006 Symposium on VLSI Technology Digest of Technical Papers, 2006, IEEE.

* cited by examiner

*Primary Examiner* — Cuong Q Nguyen
*Assistant Examiner* — Tran Tran
(74) *Attorney, Agent, or Firm* — The Nath Law Group; Jerald L. Meyer; Sungyeop Chung

(57) ABSTRACT

The present invention provides a flash memory device having a high degree of integration and high performance. The flash memory device has a double/triple gate structure where a channel is formed in a wall-shaped body. The flash memory device has no source/drain regions. In addition, although the flash memory device has the source/drain regions, the source/drain region are formed not to be overlapped with a control electrode. Accordingly, an inversion layer is induced by a fringing field generated from the control electrode, so that cell devices can be electrically connected to each other. The flash memory device includes a charge storage node for storing charges formed under the control electrode, so that miniaturization characteristics of cell device can be improved. According to the present invention, there is proposed a new device capable of improving the miniaturization characteristics of a MOS-based flash memory device and increasing memory capacity.

8 Claims, 26 Drawing Sheets

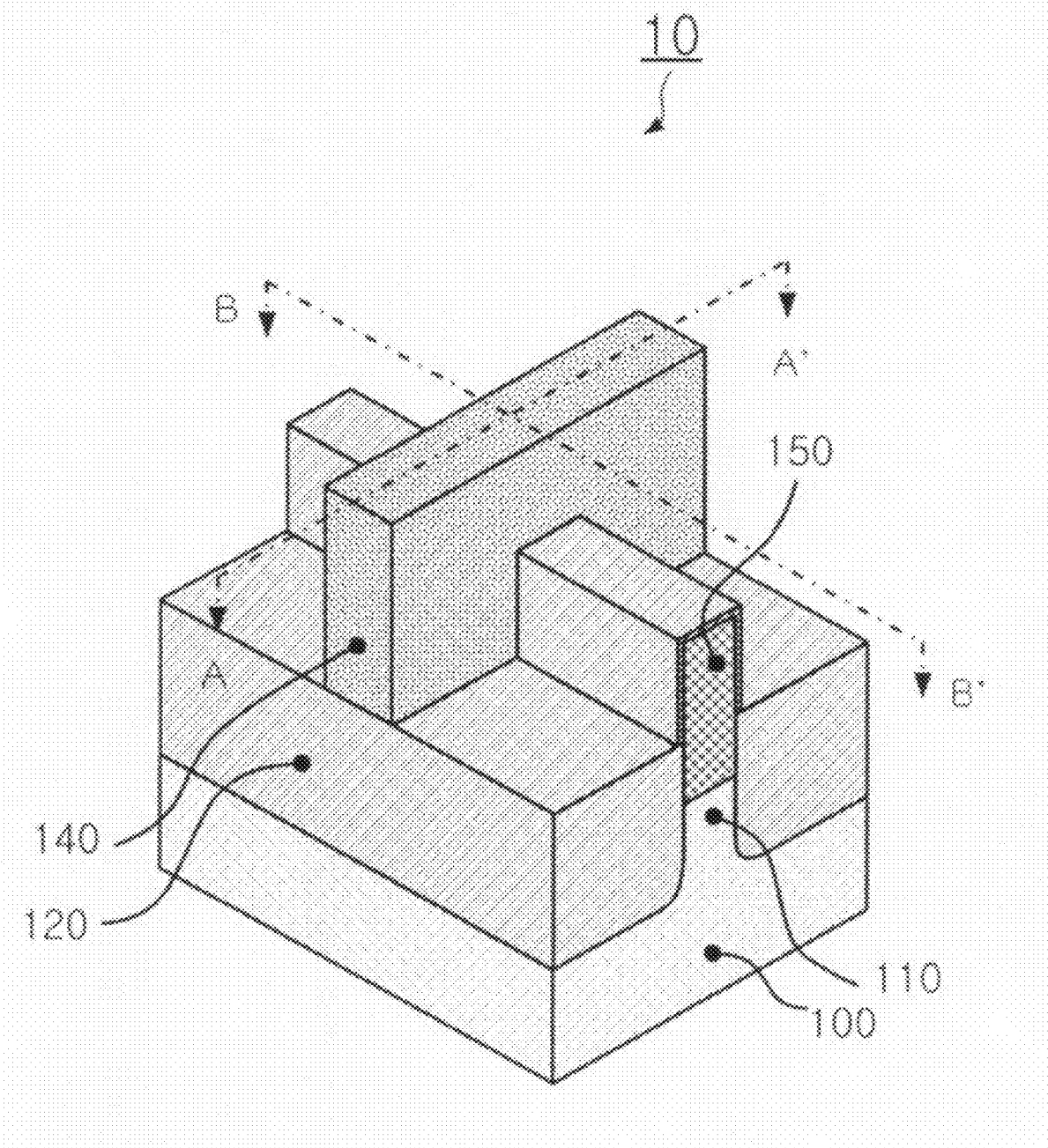

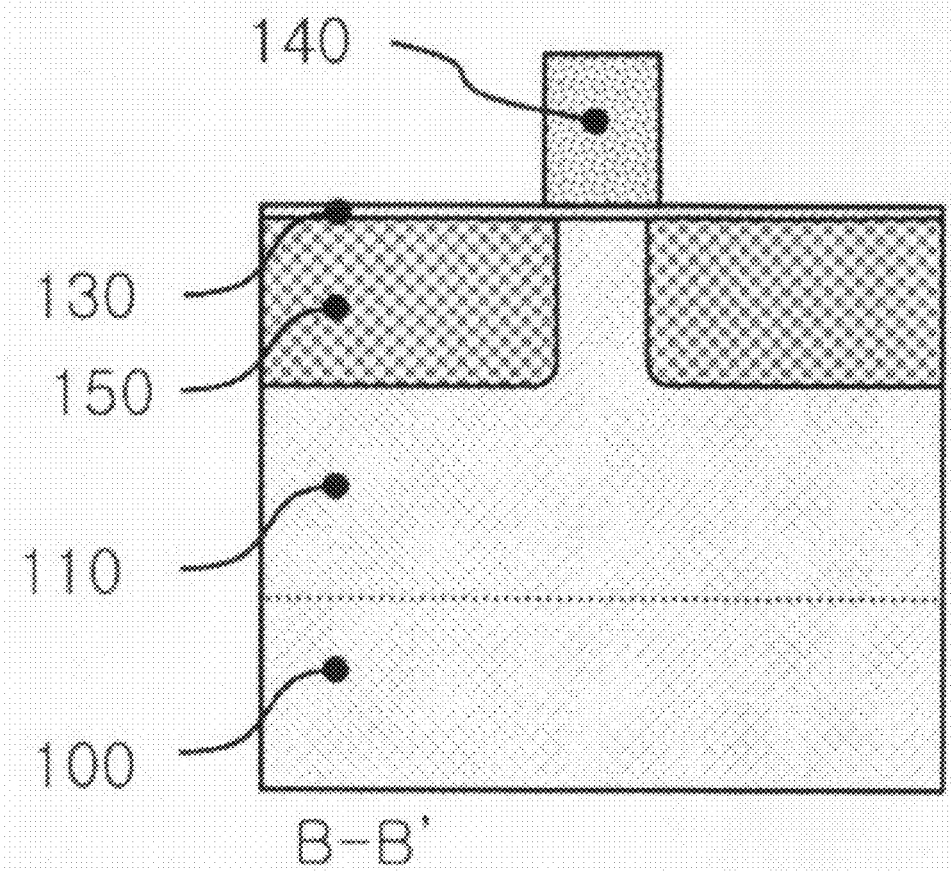

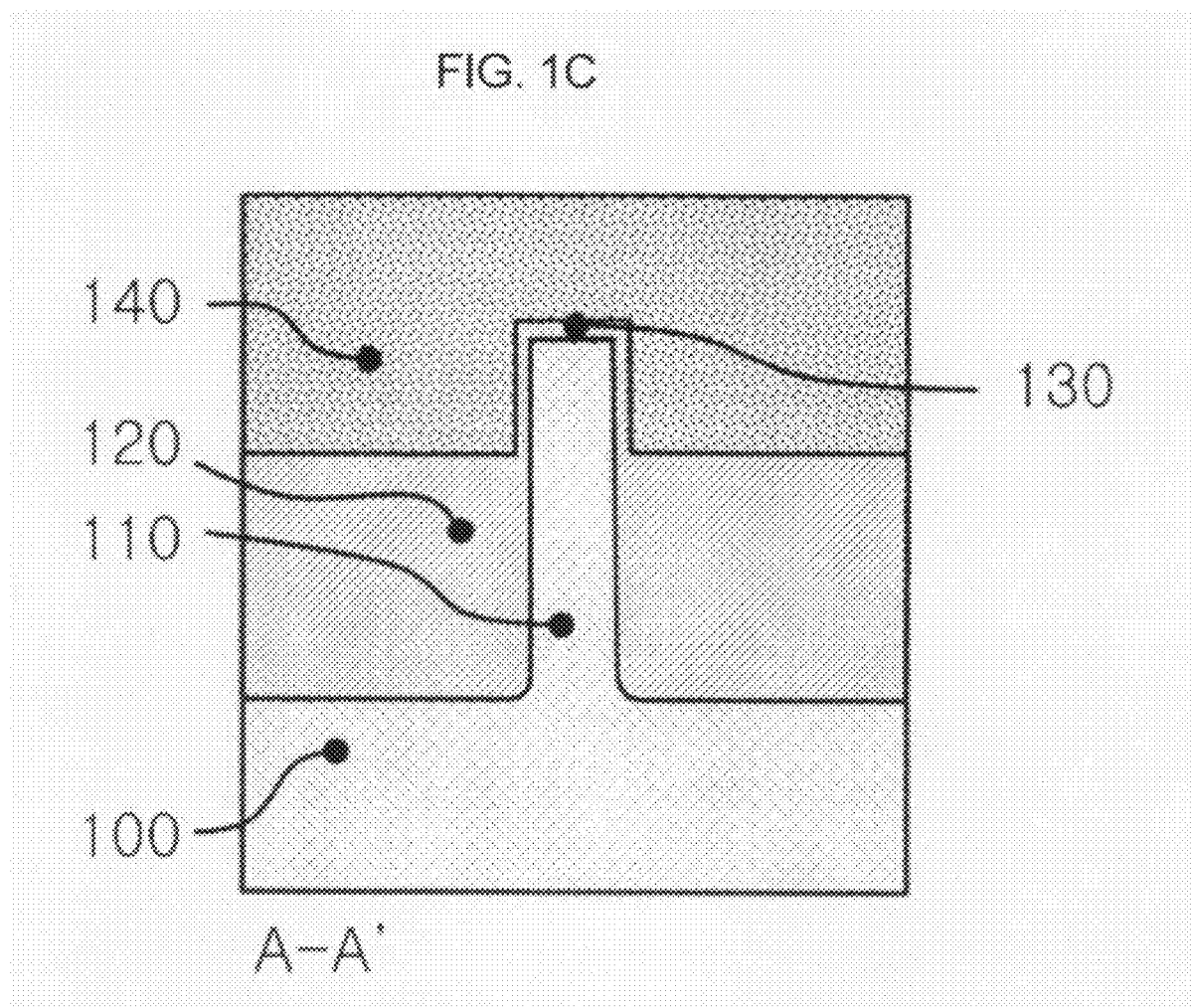

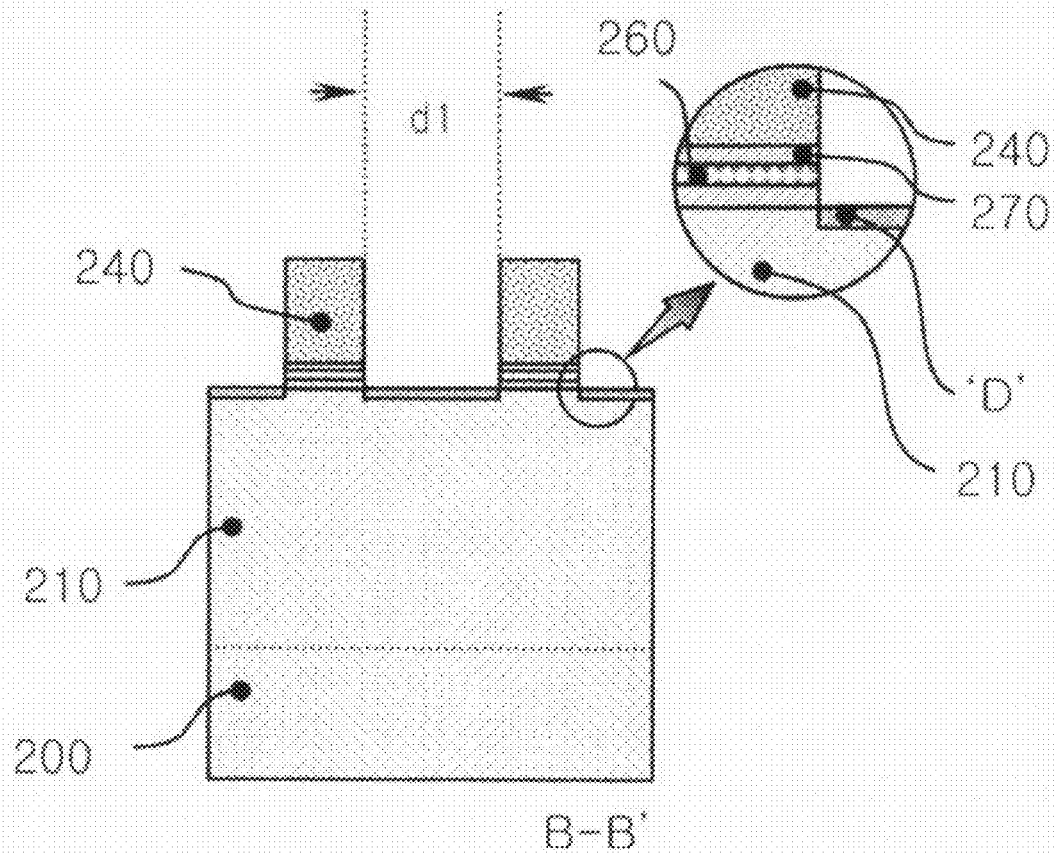

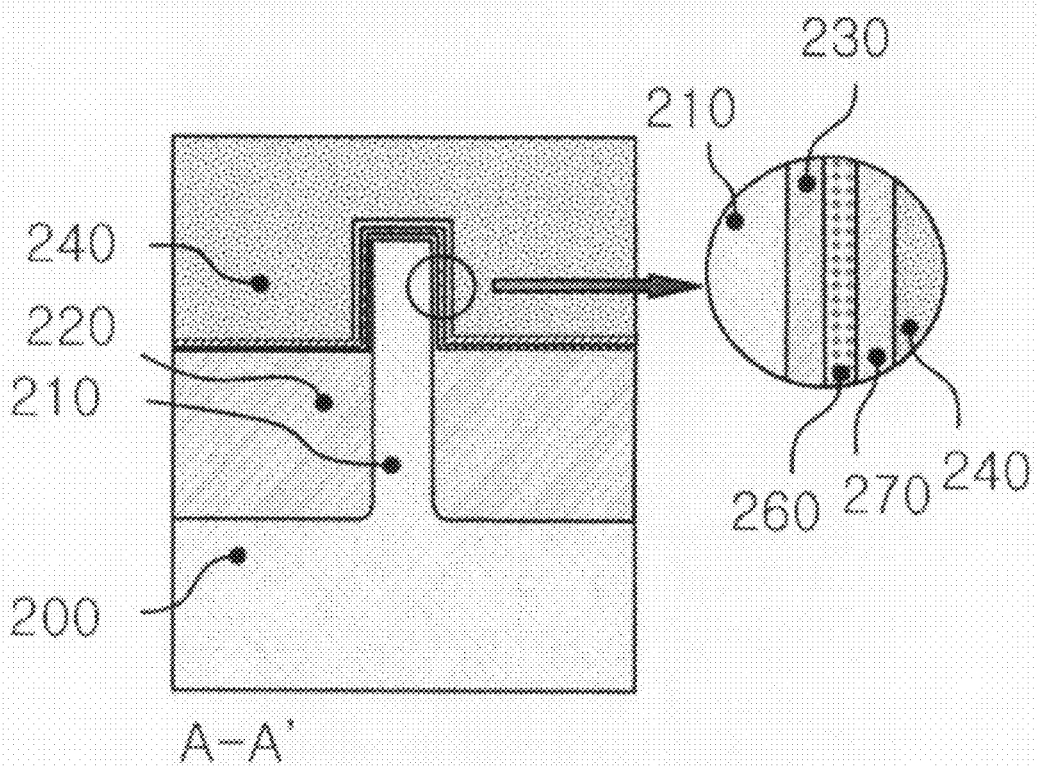

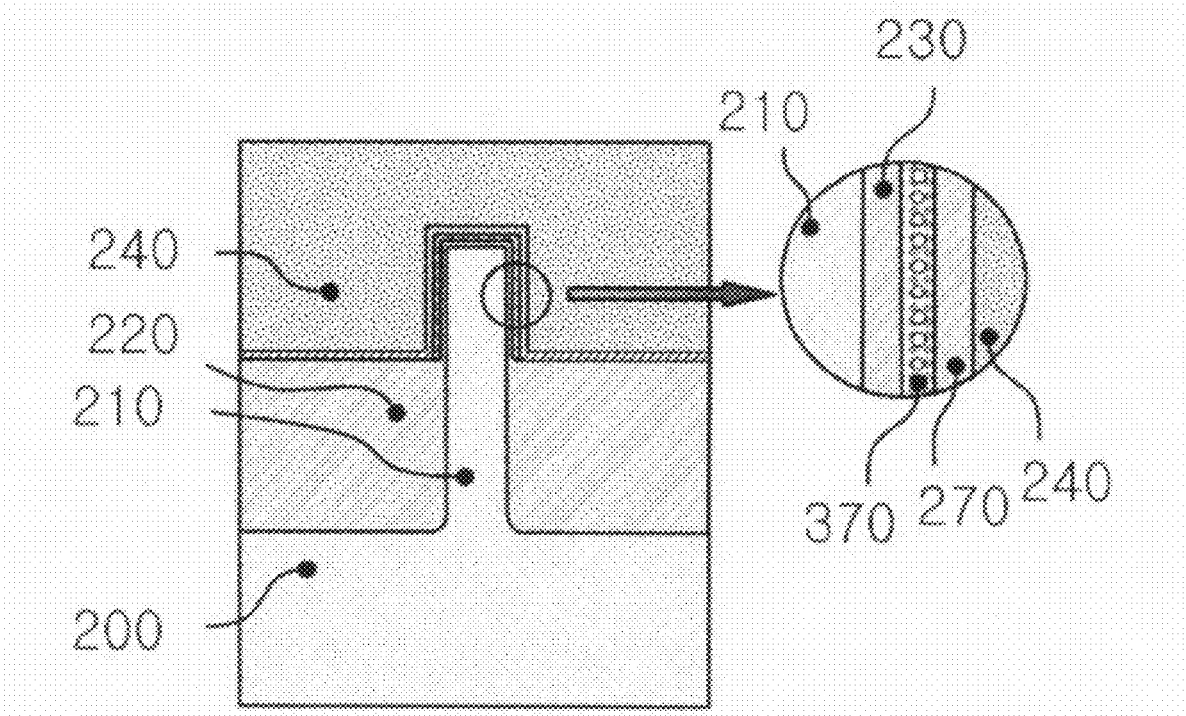

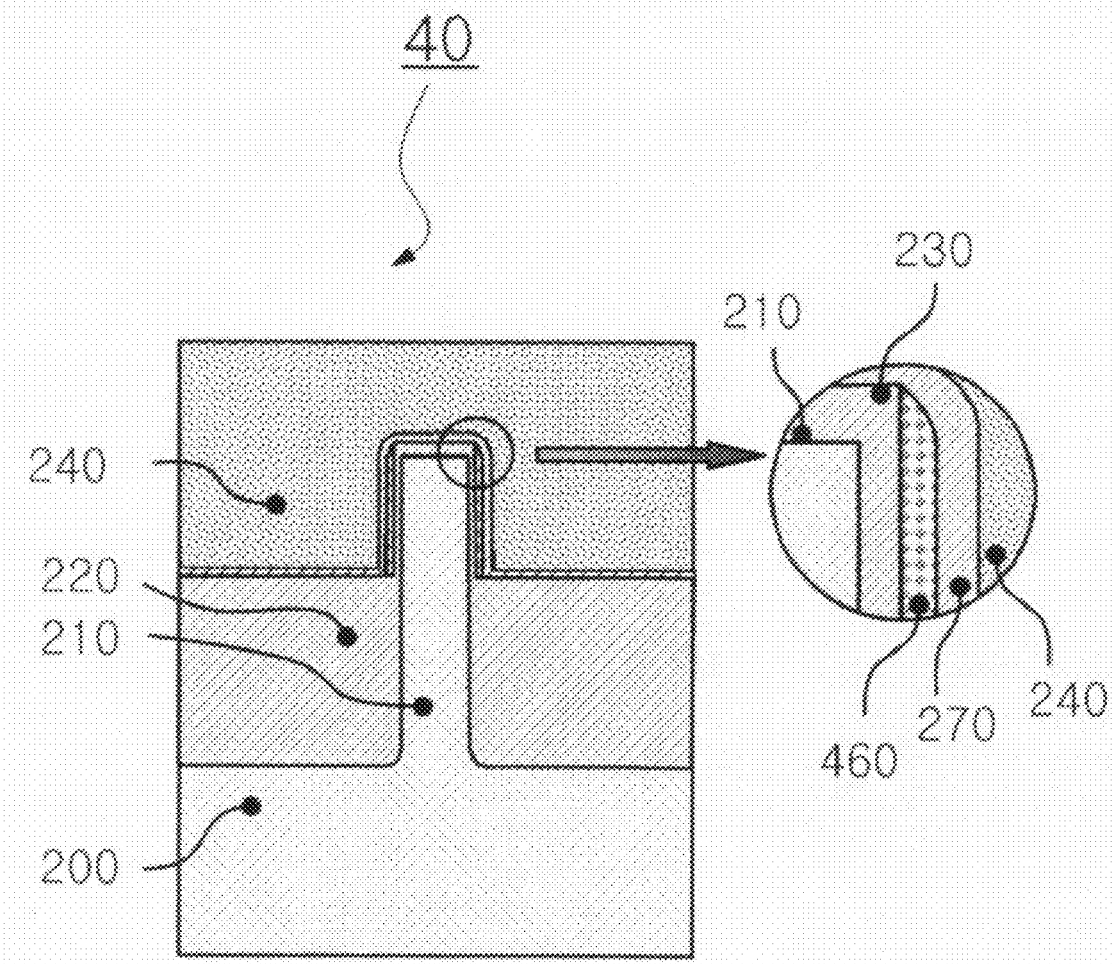

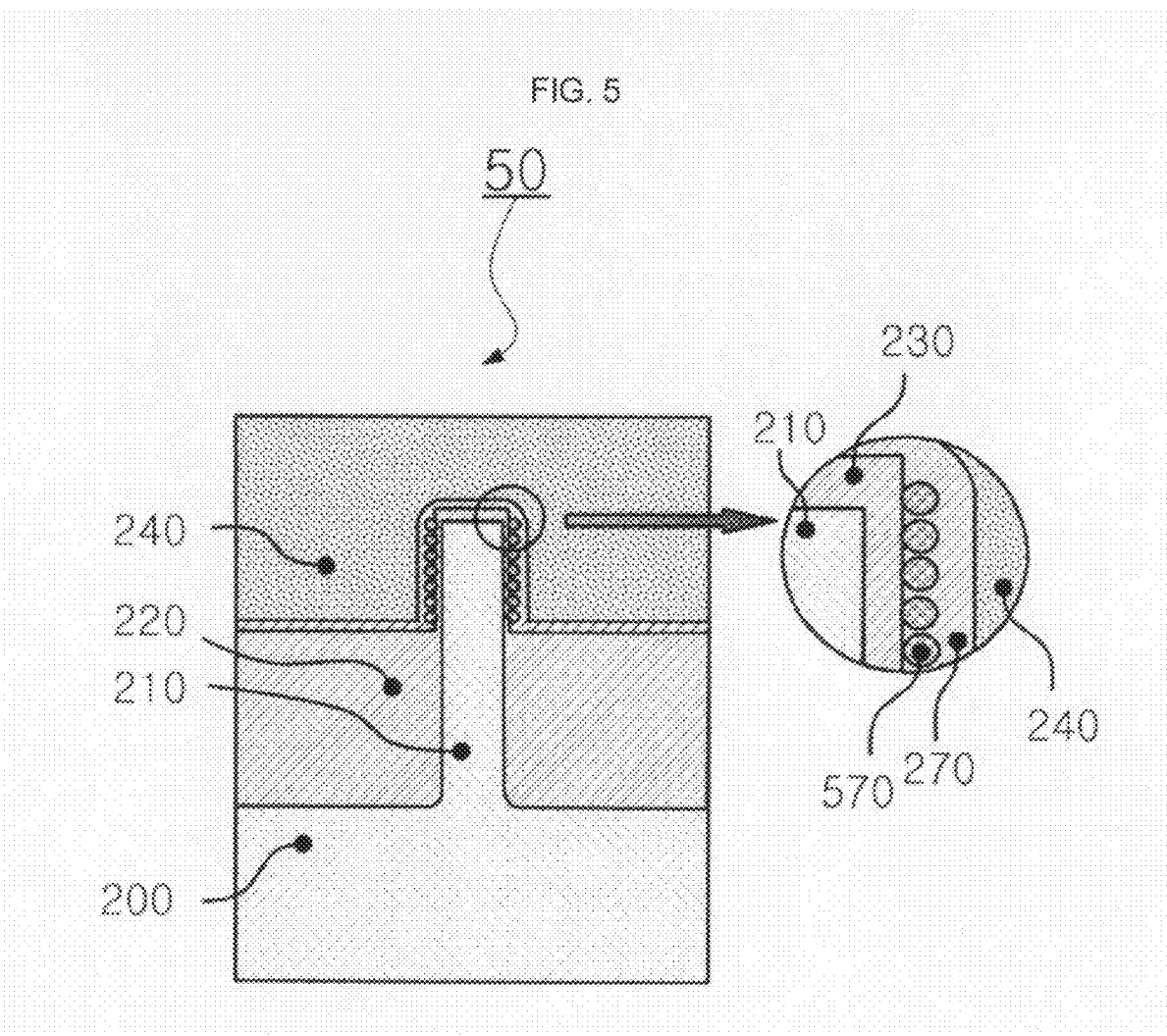

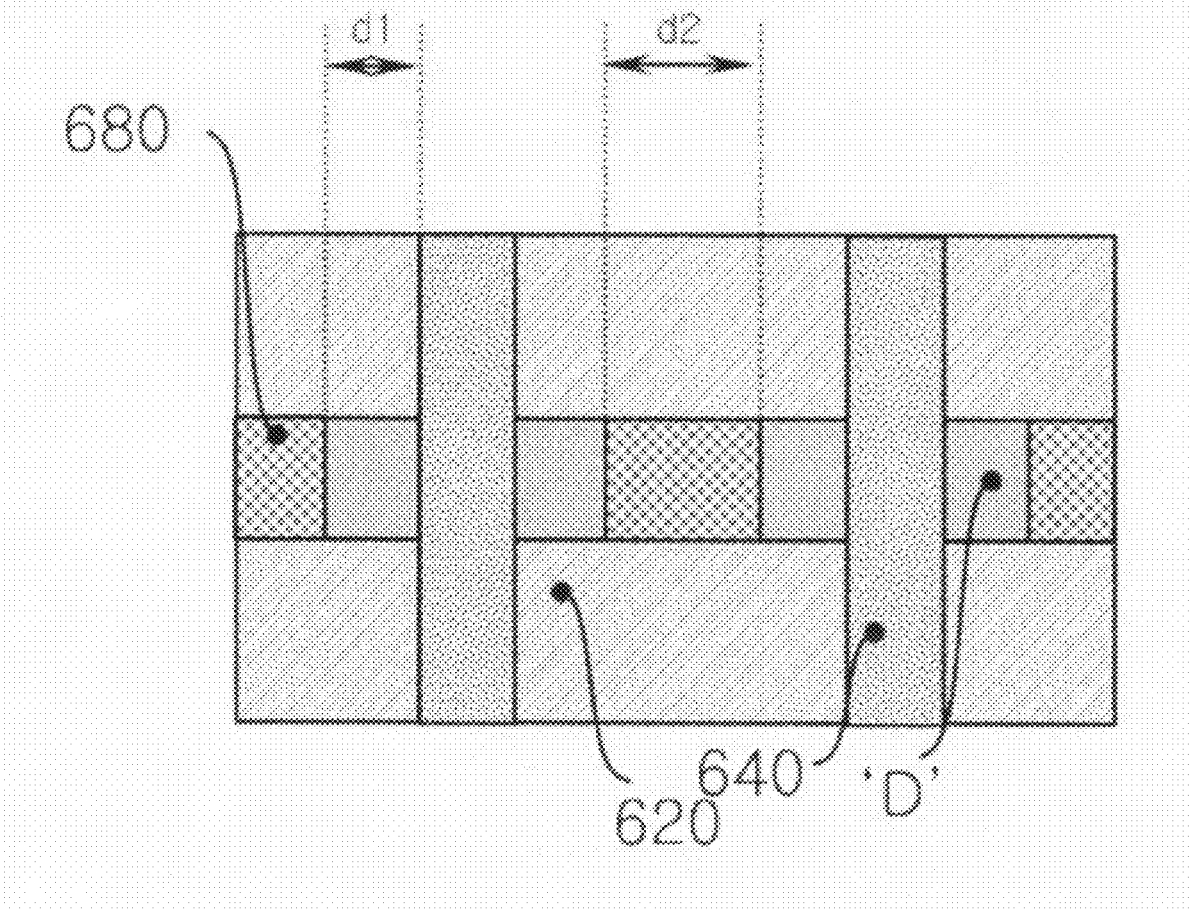

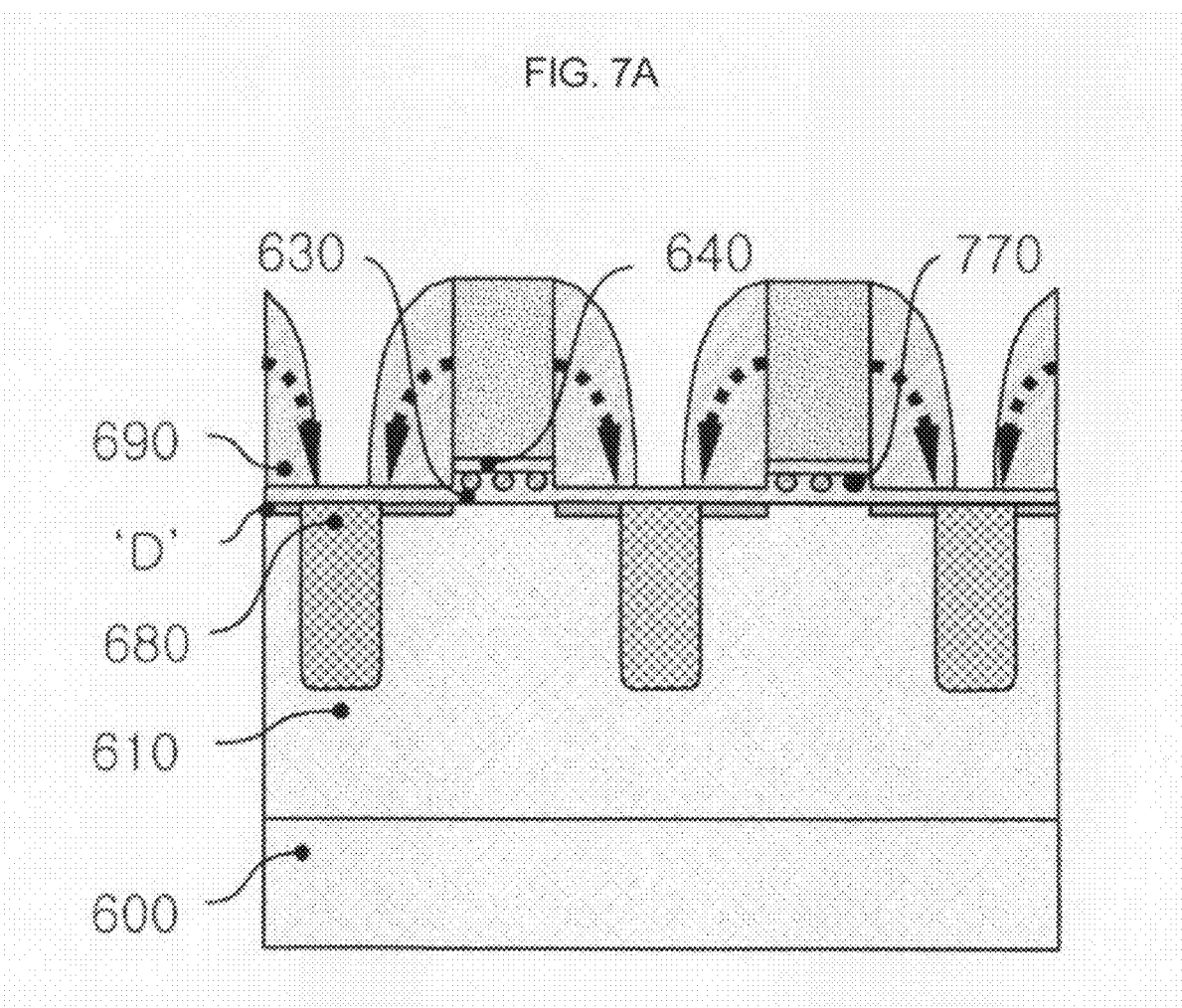

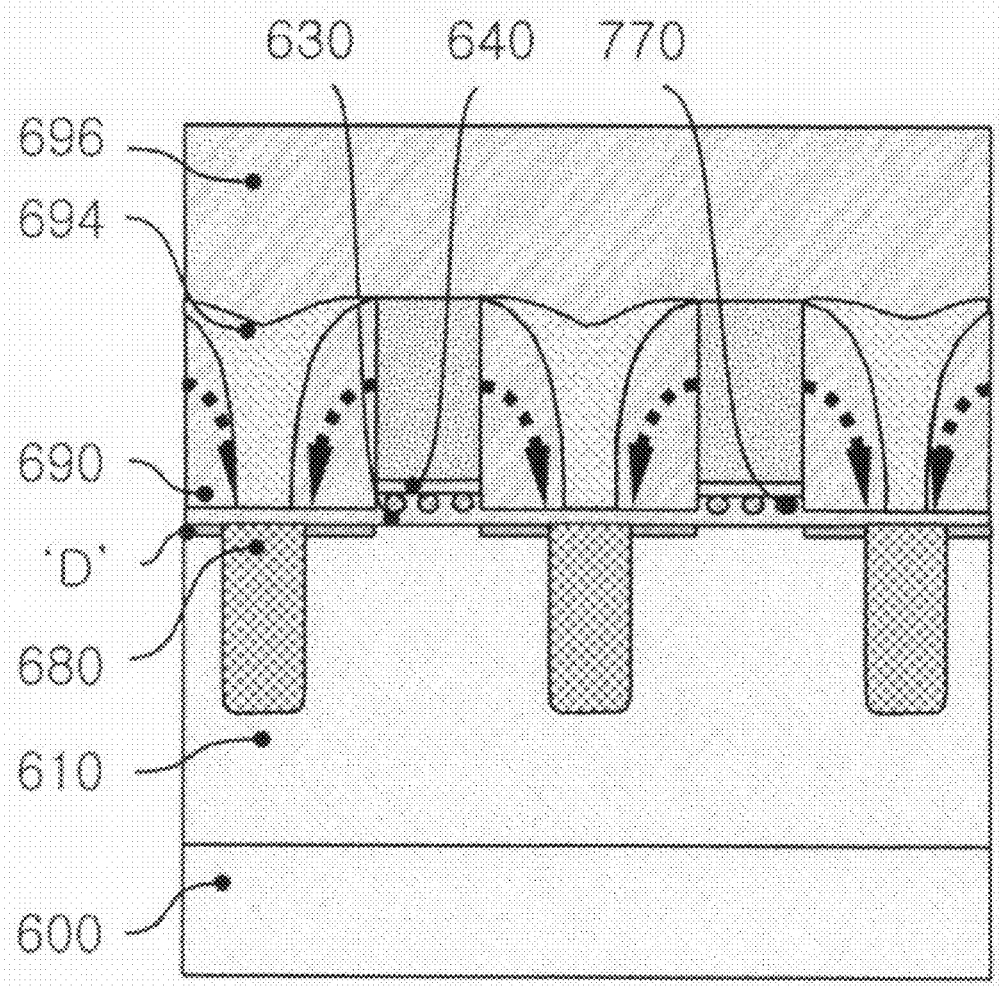

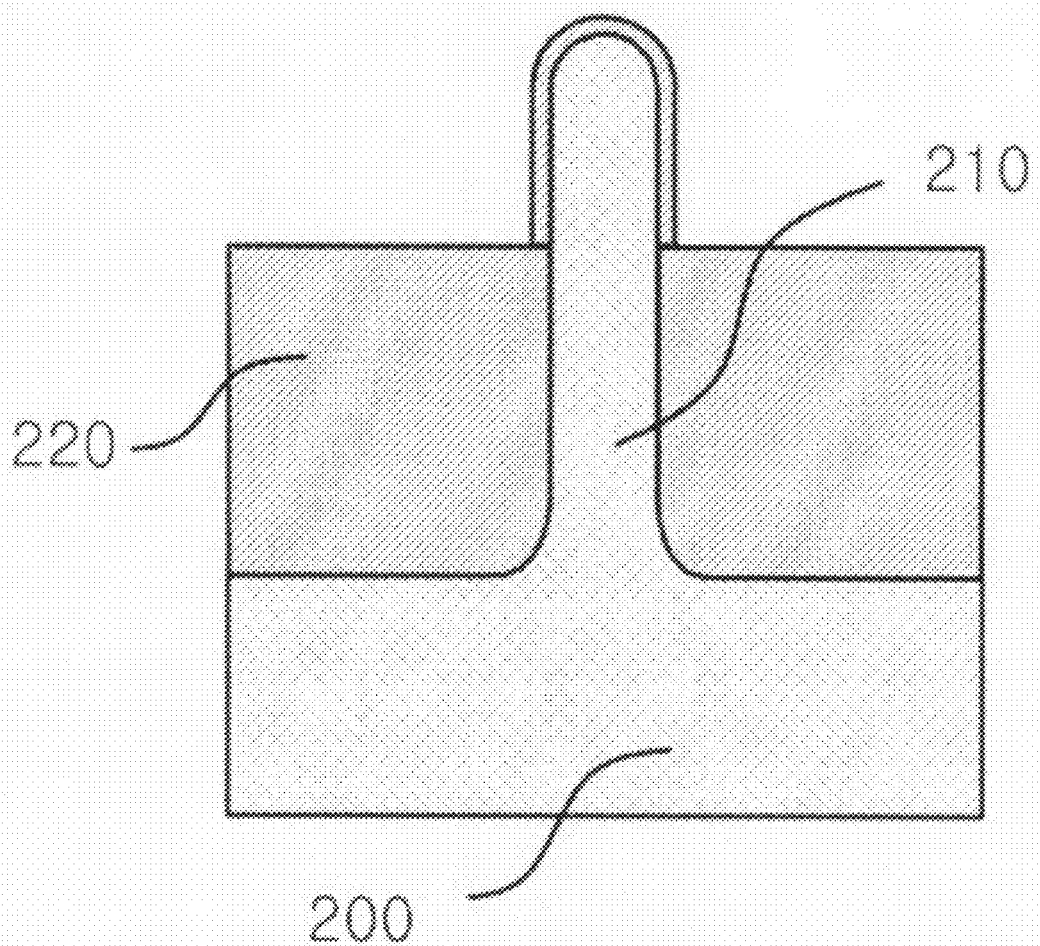

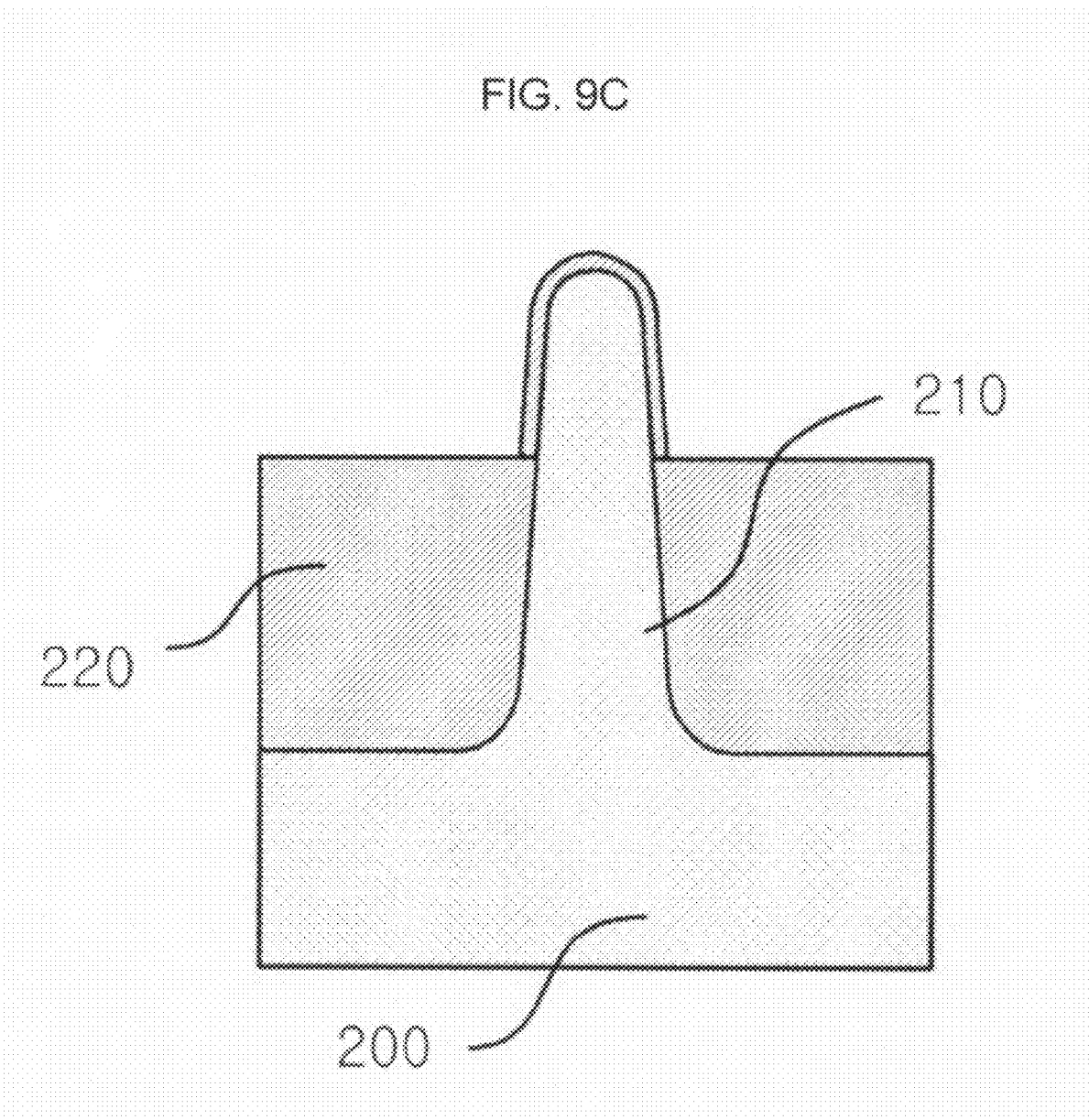

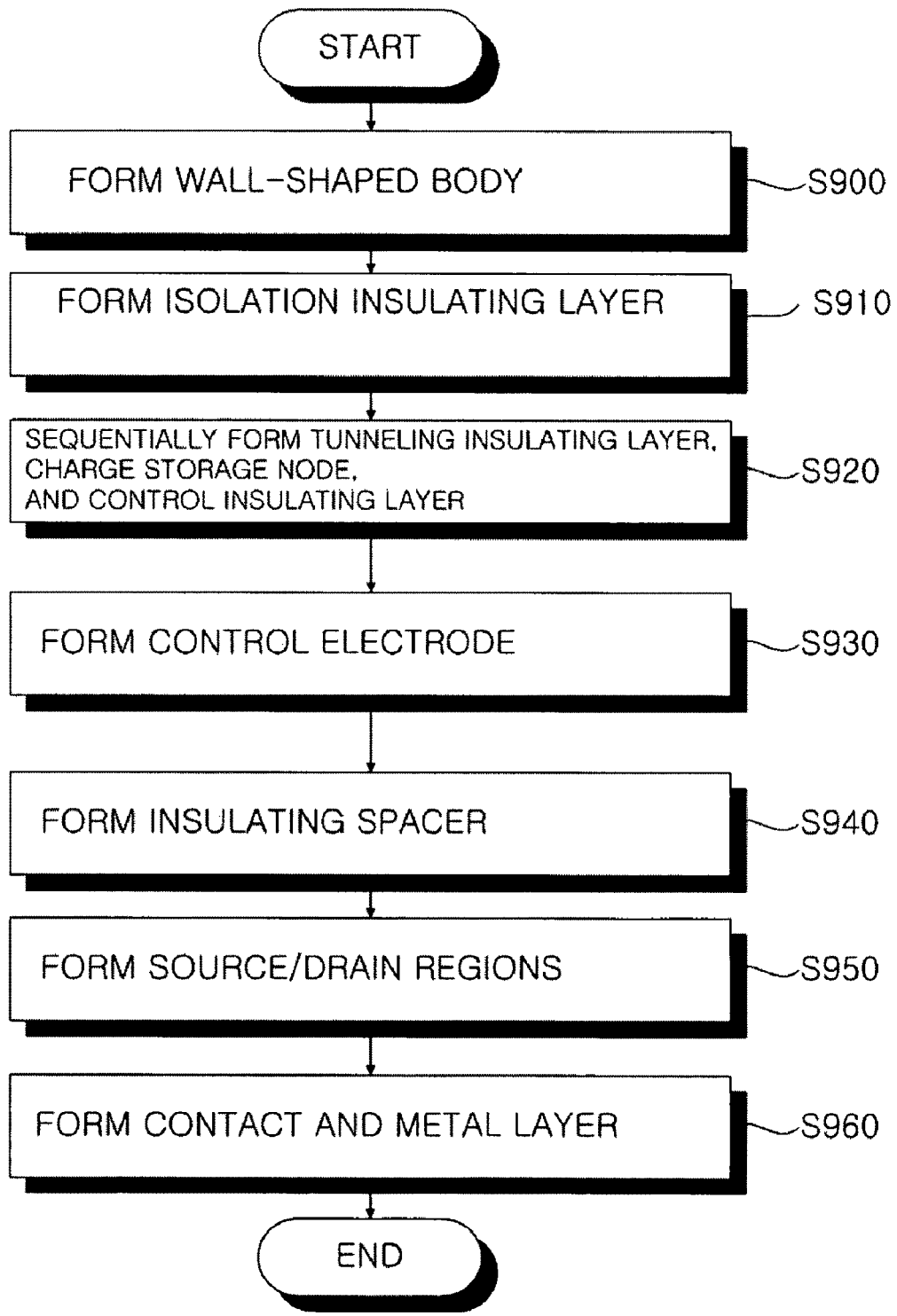

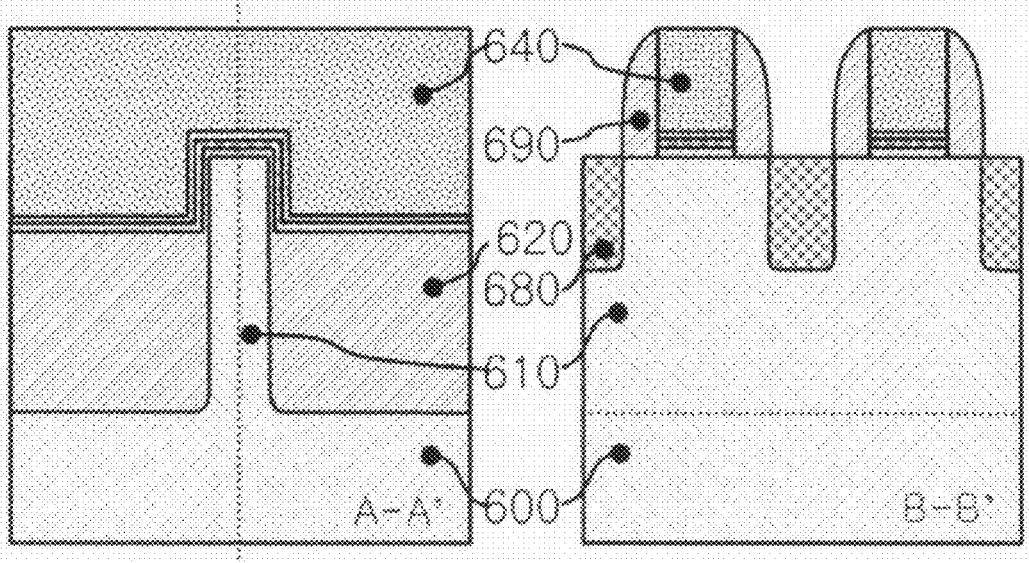

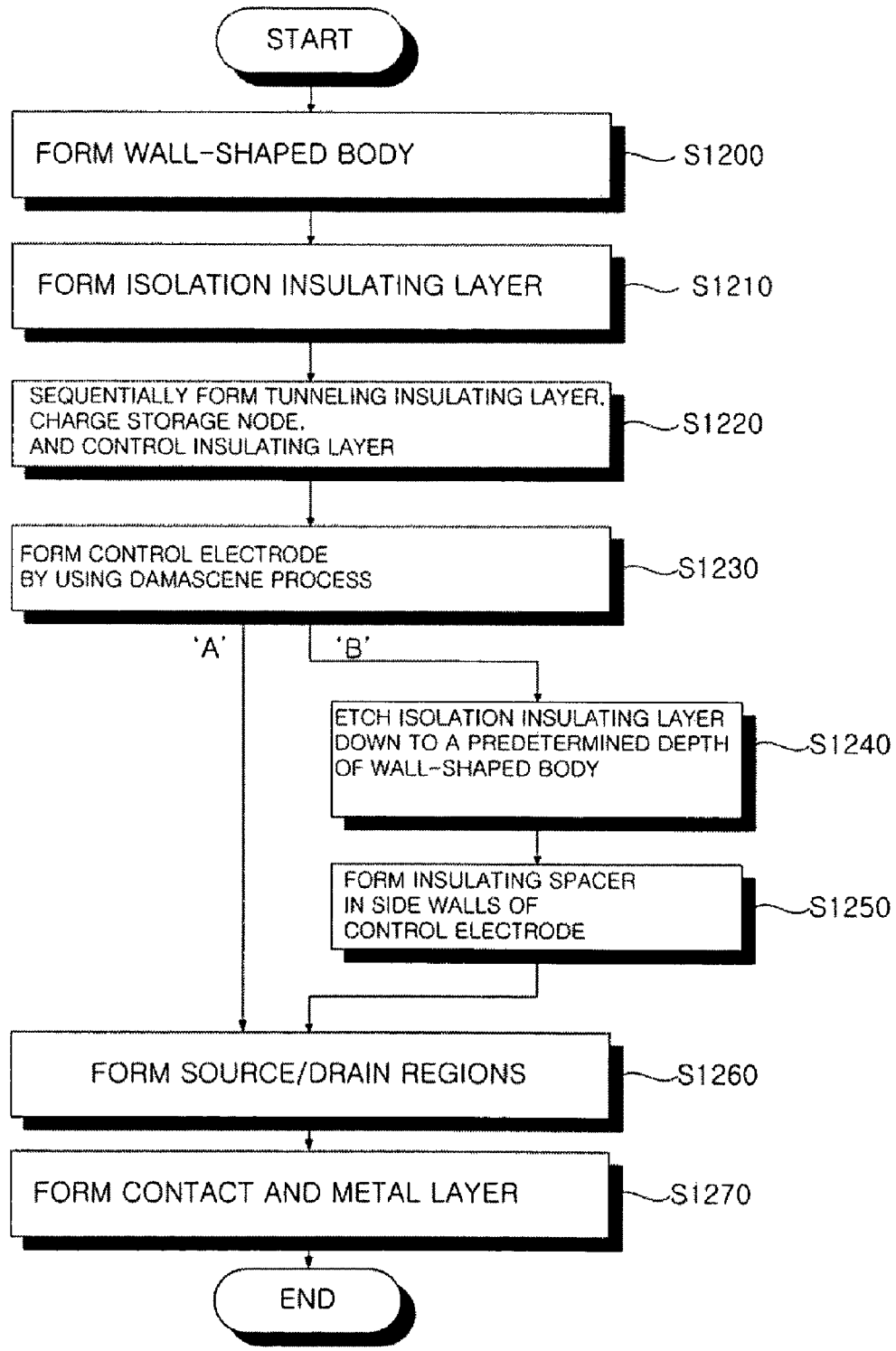

ific Application No. 10-2006-0117296, filed on Nov. 25, 2006, the entire content of which is hereby incorporated by reference in its entirety.

HIGH DENSITY FLASH MEMORY DEVICE AND FABRICATING METHOD THEREOF

This is a National Phase Application filed under 35 U.S.C. 371 as a national stage of PCT/KR2007/005801, with the filing date of Nov. 19, 2007, an application claiming the benefit of Korean Patent Application 10-2006-0117296, filed on Nov. 25, 2006, the entire content of which is hereby incorporated by reference in its entirety.

TECHNICAL FIELD

The present invention relates to a flash memory device and a fabricating method thereof, and more particularly, a flash memory device having a new structure capable of improving miniaturization characteristics and performance of a MOSFET-based flash memory device and increasing memory capacity thereof and a fabricating method thereof.

BACKGROUND ART

Recently, since demands on a flash memory greatly increase in consumer electronics and mobile electric devices, a market of the flash memory is expected to exceed a market of an existing DRAM in 2007. Therefore, a memory device with a high integration degree and a short write/erase time has been required. The integration degree of a NAND flash memory has been required to increase, as IT techniques are developed. The integration degree of the NAND flash memory greatly depends on an integration degree of cell devices constituting the memory. Recently, a length of each cell device constituting the NAND flash memory decreases below 50 nm, and a total capacity of the memory reaches tens of gigabits. Accordingly, a short channel effect becomes a big problem in the NAND flash device having a planar channel structure including an existing conductive floating gate, and thus, there is a limitation to reduce the gate length. In addition, demands on a multi-level cell have been increased. Since the short channel effect due to device miniaturization increases dispersion of a threshold voltage in the multi-level cell, there is a limitation or impossibility to use the multi-level cell.

In order to improve the integration degree of the NAND flash memory, the gate length needs to be reduced. Therefore, in order to solve the problem, other alternative techniques have to be considered. As an alternative technique, in order to increase an integration degree of a device having an existing floating poly-electrode, an SONOS flash memory cell that uses an insulating storage electrode such as a nitride layer as a memory storage node is considered. In addition, a nano-floating gate memory (NFGM) that uses nano-sized dots (or nano-sized crystals) as a storage electrode is considered. In a case where a memory cell is embodied by forming a storage electrode such as nano-sized dots or a nitride layer on an existing planar channel structure, miniaturization characteristics can be improved in comparison with a case where an existing conductive poly-silicon floating gate is used. However, although the improved storage electrode is used, in a case where the gate length is equal to or less than 40 nm, it is difficult or impossible to miniaturize a memory cell due to a short channel effect.

In order to suppress the short channel effect caused in a case where a gate length of a cell device decreases below 40 nm and reduce a dispersion of a threshold voltage, an SONOS (or TANOS: TaN—AlO—SiN-Oxide-Si) cell device having an asymmetric source/drain structure on a planar channel device is proposed by Samsung Electronics Co., Ltd (K. T. Park et al, A 64-cell NAND flash memory with asymmetric S/D structure for sub-40 nm technology and beyond, in Technical Digest of Symposium on VLSI Technology, p. 24, 2006).

In the aforementioned structure, with respect to a gate of a cell device, there is a region corresponding to a source or drain in the one side of the cell device, and there is no source or drain in the other side thereof. In the structure, the short channel effect is suppressed by forming an inversion layer using a fringing field from a control electrode in a region where there is no source or drain. Although in the aforementioned structure, a miniaturization characteristic is improved in comparison with an SONOS cell device having a planar channel and an existing source/drain region, the short channel effect occurs in a channel length equal to or less than 40 nm. As a result, there is a limitation to miniaturize a cell device having a planar channel structure.

In addition, a flash device structure in which a channel is recessed and a conductive floating gate is used as a storage electrode so as to reduce the short channel effect occurring in the existing planar channel structure is proposed by Samsung Electronics Co., Ltd. (S.-P. Sim et al, Full 3-dimensional NOR flash cell with recessed channel and cylindrical floating gate—A scaling direction for 65 nm and beyond, in Technical Digest of Symposium on VLSI Technology, p. 22, 2006). However, as the device is miniaturized, the width of a recessed region needs to be reduced. Accordingly, there is a problem in that characteristics of the device deteriorate, and non-uniformity of the device increase.

The inventor of the present invention firstly proposed a double/triple-gate flash memory cell structure formed on an SOI substrate (see Korean Patent No. 10-431-489 and U.S. Pat. No. 6,768,158 B2) a body-tied double/triple-gate flash memory cell structure formed on a bulk substrate (see Korean Patent No. 10-420070 and U.S. patent application Ser. No. 10/751,860). In the double/triple-gate structure proposed by the inventor, a gate electrode surrounds a gate structure region so as to improve a controllability of the gate electrode to the channel. The structure is referred to a bulk fin field effect transistor (bulk FinFET) by the inventor. In the structure, the channel is formed in an upper surface and both side surfaces of a wall-shaped body having a shape protruding from a substrate, or the channel is formed at both sides of the wall-shaped body, so that the controllability of the gate electrode to the channel can be improved in comparison with an existing planar channel device.

Hereinafter, a structure and operations of the aforementioned double/triple-gate device proposed by the inventor will be described with reference to FIG. 1. In FIG. 1, (a) is a three-dimensional perspective view illustrating a double/triple metal oxide semiconductor (MOS) device formed on a bulk substrate, (b) is a cross-sectional view taken along line B-B', and (c) is a cross-sectional view taken along line A-A'. As shown in FIG. 1, the double/triple-gate device 10 include a bulk silicon substrate 100, a wall-shaped body 110, an isolation insulating layer 120, a tunneling insulating layer 130, a gate electrode 140, and source/drain regions 150.

The wall-shaped body 110 is formed by patterning the bulk silicon substrate 100 in a wall shape having predetermined height, width, and length. The isolation insulating layer 120 is made of an electrically insulating material and formed up to a surface of the substrate and a predetermined height of the wall-shaped body, so as to electrically isolate devices to be formed on the substrate 100. The tunneling insulating layer 130 formed on side walls and the upper surface of the wall-shaped body that protrude over the isolation insulating layer. The gate electrode 140 is formed on the gate insulating layer and the insulating layer in a direction perpendicular to a longitudinal direction of the wall-shaped body. The source/drain regions 150 are formed in regions of the wall-shaped body where the gate electrode is not formed.

In the double/triple-gate device having the aforementioned construction, the channel of the device is formed on the surface and side surfaces of the wall-shaped body 110 protruding over the isolation insulating layer 120, and the gate electrode 140 is formed on the surface and side surfaces of the protruding wall-shaped body, so that the controllability to the channel can be greatly improved. As a result, the miniaturization characteristics of the device can be improved, and the write/erase characteristics can be also improved. However, as the gate length of the cell device gradually decreases below 40 nm, the short channel effect is still remained although it is smaller than the short channel effect of the planar channel structure. Therefore, there is a need for solving the problem of the short channel effect.

Accordingly, in order to solve the problems of the aforementioned existing devices, a flash memory device having a high degree of integration and high performance with a new structure capable of suppressing the short channel effect and deterioration in performance needs to be developed.

DISCLOSURE

Technical Problem

In order to solve the aforementioned problems, the present invention provides a flash memory device capable of obtaining excellent miniaturization characteristics, reducing dispersion of a threshold voltage, and improving write/erase characteristics in implementation of a MOS-based ultra-fine flash device.

The present invention also provides a flash memory device suitable for operations of a NAND flash memory device and capable of minimizing a short channel effect in comparison with an existing planar channel structure.

The present invention also provides a NAND flash memory string using the flash memory device having the aforementioned structure as a cell device.

The present invention also provides a method of fabricating the flash memory device having the aforementioned structure.

Technical Solution

According to an aspect of the present invention, there is provided a flash memory device comprising: a semiconductor substrate; a wall-shaped body connected to the semiconductor substrate and protruding from the semiconductor substrate in a wall shape; an isolation insulating layer made of an insulating material and formed between adjacent wall-shaped bodies so as to electrically isolate devices which are to be formed in the adjacent wall-shaped bodies; an interlayer insulating layer formed on exposed upper surface and side walls of the wall-shaped body which are exposed by etching the isolation insulating layer by a predetermined depth from an upper surface of the wall-shaped body; and a control electrode formed on the interlayer insulating layer in a direction perpendicular to the wall-shaped body, wherein the interlayer insulating layer comprises: a tunneling insulating layer formed on the exposed upper surface and side walls of the wall-shaped body; a charge storage node formed on the tunneling insulating layer to store charges; a control insulating layer formed on the charge storage node, wherein the control insulating layer is formed between the charge storage node and the control electrode, wherein source/drain regions are not formed in regions adjacent to the control electrode, and wherein the flash memory device is operated as a cell device by a fringing field generated by a voltage applied to the control electrode.

According to another aspect of the present invention, there is provided a flash memory device comprising: a semiconductor substrate; a wall-shaped body connected to the semiconductor substrate and protruding from the semiconductor substrate in a wall shape; an isolation insulating layer made of an insulating material and formed between adjacent wall-shaped bodies so as to electrically isolate devices which are to be formed in the adjacent wall-shaped bodies; an interlayer insulating layer formed on exposed upper surface and side walls of the wall-shaped body which are exposed by etching the isolation insulating layer by a predetermined depth from an upper surface of the wall-shaped body; a control electrode formed on the interlayer insulating layer in a direction perpendicular to the wall-shaped body; and source/drain regions formed in a region of the wall-shaped region which is not intersected by the control electrode, the source/drain regions being separated by a predetermined distance from the control electrode so as for the source/drain electrodes not to be overlapped with the control electrode, wherein the flash memory device is operated as a cell device by a fringing field generated by a voltage applied to the control electrode.

It is preferable that the interlayer insulating layer of the aforementioned flash memory device comprises: a tunneling insulating layer formed on the exposed upper surface and side walls of the wall-shaped body; a charge storage node formed on the tunneling insulating layer to store charges; a control insulating layer formed on the charge storage node, wherein the control insulating layer is formed between the charge storage node and the control electrode.

Advantageous Effects

According to the present invention, a NAND flash memory cell constituting a cell string of a NAND flash memory is constructed as a cell device having a double/triple-gate structure where there are no source/drain regions or the source/drain regions are not overlapped with a control electrode, so that a short channel effect can be effectively suppressed even in a gate length of equal to or less than 40 nm in comparison with an existing double/triple-gate structure. Accordingly, miniaturization characteristics can be further improved.

In addition, in comparison with an SONOS-type NAND flash cell device having an existing planar channel structure, in a cell device according to the present invention, it is possible to obtain a high degree of integration due to the double/triple-gate structure. In addition, in a memory device having an existing planar channel where an inversion layer cannot be easily formed, in a memory device having a structure according to the present invention, there are no source/drain regions or the source/drain regions that are not overlapped with a control electrode are formed by using a wall-shaped body, so that the inversion layer can be easily formed by a fringing field generated from a side surface of the control electrode.

In addition, according to the present invention, source/drain regions are not formed in a cell device of a NAND string, and although the source/drain regions are formed in the cell device, the source/drain regions are not overlapped with a control electrode, so that gate induced drain leakage (GIDL) is relatively small. Accordingly, it is possible to further reduce an off-state current. In particular, according to the present invention, in a case where the source/drain regions are not formed in the cell device, a junction leakage current does not occur between the source/drain regions and a substrate. In addition, according to the present invention, although the source/drain regions that are not overlapped with the control electrode are formed in the cell device, since widths of the source/drain regions are small, so that the junction leakage current can be reduced.

DESCRIPTION OF DRAWINGS

FIG. 1 illustrates views of a conventional double/triple-gate MOS device, in which (a) is a three-dimensional perspective view, (b) is a cross-sectional view taken along line B-B', and (c) is a cross-sectional view taken along line A-A' of a control electrode.

FIGS. 3, 4, and 5 are cross-sectional views for explaining various modified examples of charge storage nodes in the flash memory device according to the embodiment of the present invention.

FIG. 7 (a) is a cross-sectional view for explaining another example of charge storage nodes in the flash memory device according to the first embodiment of the present invention, and FIG. 7 (b) a cross-sectional view illustrating a structure that a space between spacers in (d) is filled with insulating materials having different dielectric constants and an insulating material is formed thereon.

FIG. 10 is a flowchart illustrating a sequence of steps in a fabricating method of the flash memory device according to the first embodiment of the present invention.

FIG. 12 is a flowchart illustrating another example of the fabricating method of the flash memory device according to the first embodiment of the present invention.

BEST MODE

Hereinafter, constructions and operations of embodiments of the present invention will be described in detail with reference to the accompanying drawings.

Figure 2A:
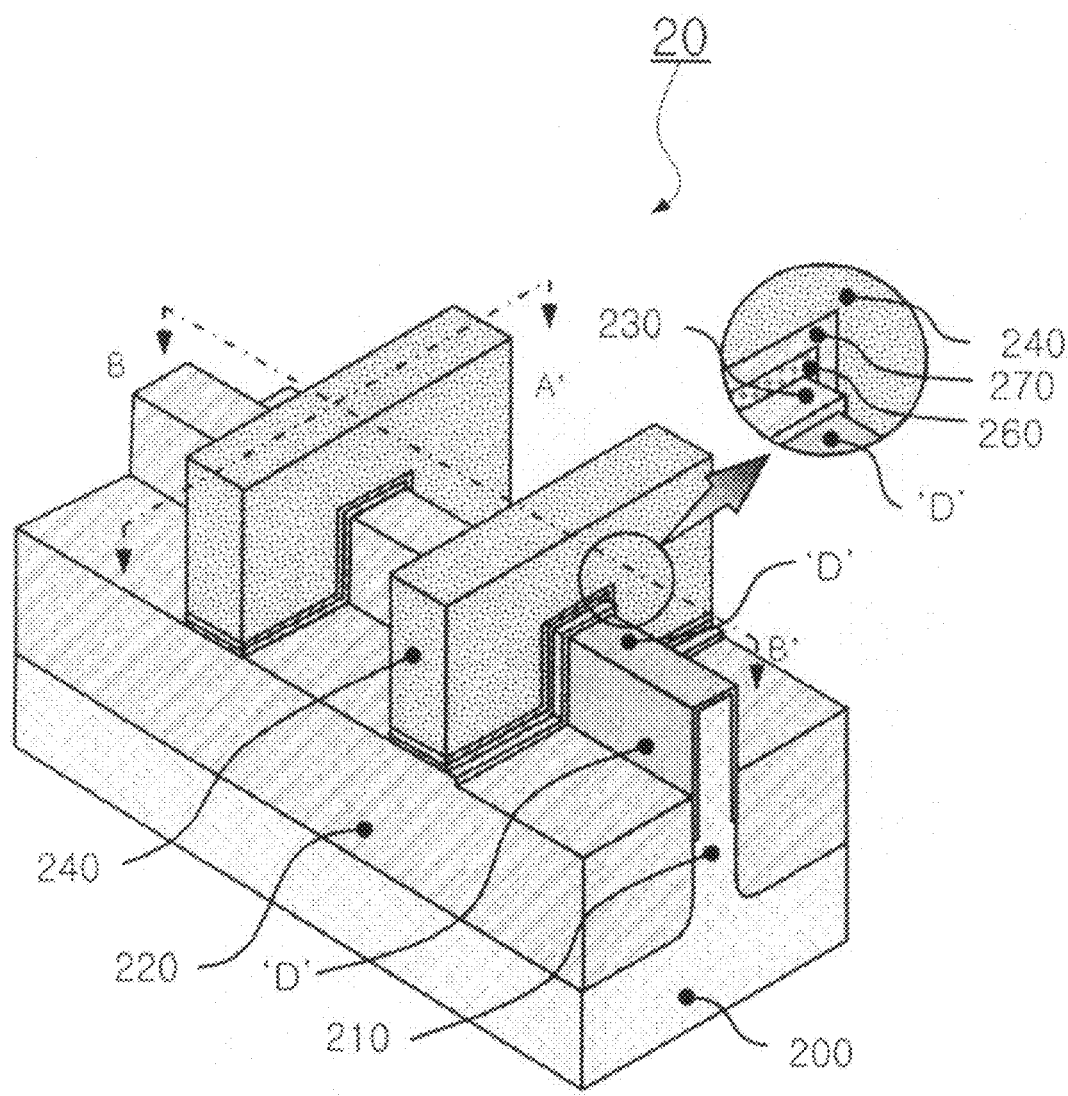
FIG. 2 illustrates views of a flash memory device according to an embodiment of the present invention, in which (a) is a perspective view illustrating a portion of a cell string including the flash memory device, (b) is a plan view thereof, (c) is a cross-sectional view taken along line B-B', and (d) is a cross-sectional view taken along A-A'.
Figure 2B:
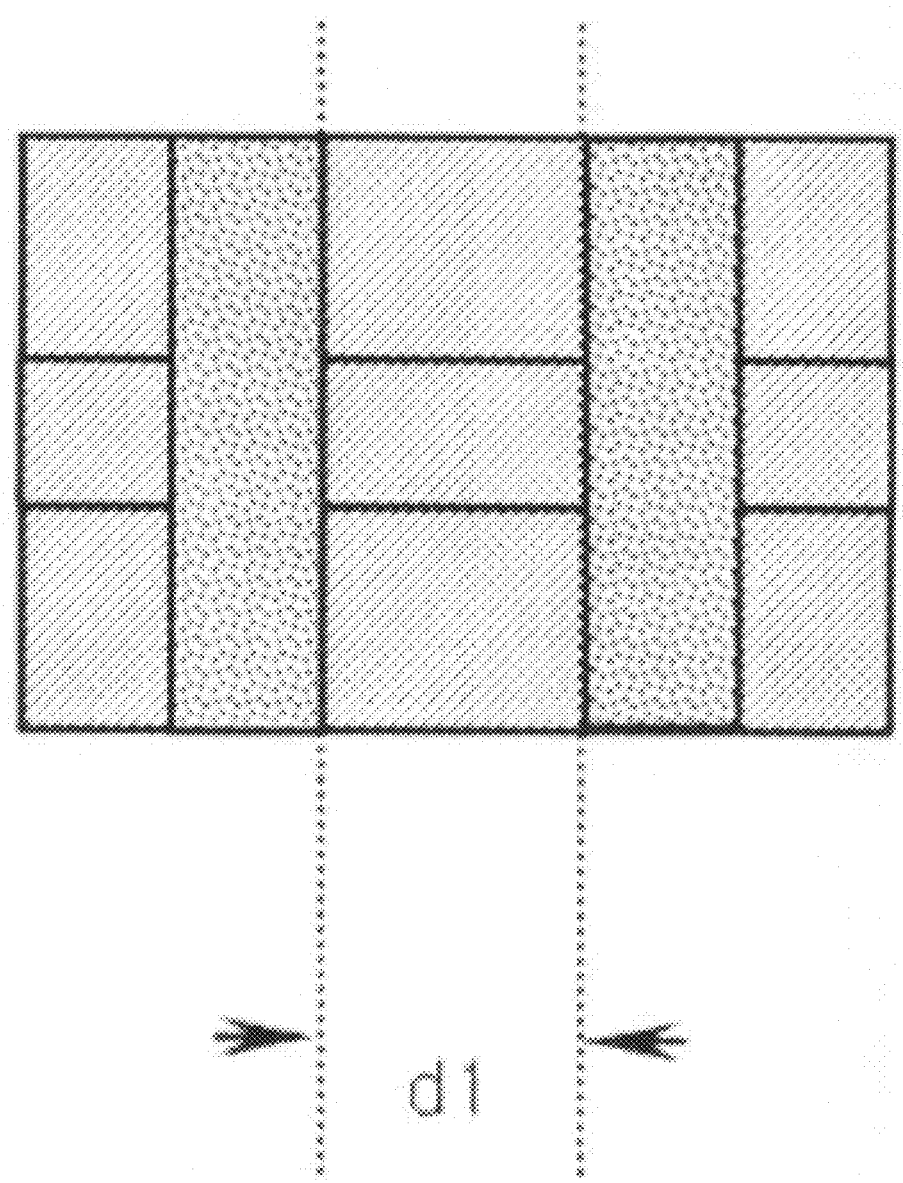

A structure of a NAND flash memory device according to an embodiment of the present invention will be described with reference to FIG. 2. The memory device according to the embodiment of the present invention is characterized in that the memory device is not provided with source/drain regions. In FIG. 2, (a) is a perspective view illustrating a portion of a cell string including the NAND flash memory device according to the embodiment of the present invention, in which two cell devices and two word lines are disposed in the cell string. In FIG. 2, (b) is a plan view of (a) of FIG. 2, (c) is a cross-sectional view taken along line B-B' of (a) of FIG. 2, and (d) is a cross-sectional view taken along line A-A' of (a) of FIG. 2. In FIG. 2, some layers in a left region of a right-side device are removed for the better understanding of the structure of the device. In addition, regions formed after formation of a control electrode are omitted so as to illustrate only the main components. Firstly, a whole structure of the flash memory device will be described.

Referring to FIG. 2, the flash memory device 20 according to the embodiment of the present invention includes a bulk silicon substrate 200, a wall-shaped body 210, an isolation insulating layer 220, a tunneling insulating layer 230, a control electrode 240, a charge storage node 260, and a control insulating layer 270. In the construction of the flash memory device 20, the wall-shaped body 210 is formed to be connected to the bulk silicon substrate 200, a protective insulating layer (not shown) is formed on surfaces of the substrate 200 and the wall-shaped body 210; the isolation insulating layer 220 for device isolation is formed on the protective insulating layer up to the vicinity of the surface of the wall-shaped body 210; an upper portion and side surfaces of the wall-shaped body 210 are exposed by etching the protective insulating layer and the isolation insulating layer 220 by a predetermined depth from the upper surfaces of the wall-shaped body 210; the tunneling insulating layer 230 is formed on the exposed upper portion and side surfaces of the wall-shaped body; the charge storage node 260 and the control insulating layer 270 are sequentially formed on the tunneling insulating layer 230; and the control electrode 240 is formed thereon. An additional insulating layer (not shown) having a predetermined thickness is formed on the resulting product, and contacts (not shown) and metal interconnection layers (not shown) are formed in a device of a region where the cell device is excluded.

In particular, the flash memory device having the aforementioned structure according to the preferred embodiment of the present invention is provided as a cell device of an NAND flash memory. In the flash memory device, individual cell devices in a cell string are not provided with source/drain regions. Therefore, when a predetermined voltage is applied to the control electrode 240, a fringing field is generated on a side surface of the control electrode 240, and thus, an inversion layer ("D" region in (a) of FIG. 2) is generated on the region of the wall-shaped body between the control electrodes due to the fringing field, so that the cell device can be operated by the inversion layer. As a result, according to the present invention, since the source and drain regions are removed from the cell device, the short channel effect caused from the miniaturization of device can be suppressed, so that the miniaturization characteristics can be improved.

The cell device having the aforementioned structure according to the embodiment can be suitably adapted to an NAND flash memory, so that it can be very effectively operated. The cell array constituting the NAND flash memory is constructed with multiple cell strings. As described above, the cell device according to the present invention can be used as cell devices constituting the cell strings of the cell array.

The flash memory string using the flash memory device according to the preferred embodiment of the present invention include multiple cell devices connected in a string shape and first and second switching devices. The cell devices can be adapted to the flash memory devices according to the preferred embodiment of the present invention. The first and second switching devices are attached to respective ends of the string. Each of the first and second switching devices includes source and drain regions or selectively one of the source and drain regions. In a case where each of the first and second switching devices includes selectively one of the source and drain regions, the first switching device is not provided with the source region at the side that is connected to the cell device but provided with the drain region at the side that is not connected to the cell device. The second switching device is not provided with the drain region at the side that is connected to the cell device but provided with the source region at the side that is not connected to the cell device. It is preferable that resistance is reduced by increasing a concentration of the source/drain regions formed in a region where the cell device is excluded The wall-shaped body 210 is formed by etching the substrate 200 so that a height thereof is defined in a range of 50 nm to 1000 nm and a width thereof is defined in a range of 2 nm to 200 nm. As shown in (a) and (b) of FIG. 9, preferably, both corners of the upper surface of the wall-shaped body 210 may be formed to have an angled shape, or the upper surface thereof may be formed to have a semi-cylindrical shape or a semi-elliptical shape. In addition, as shown in (c) and (d) of FIG. 9, the vertical profile of the wall-shaped body 210 may be formed to have a uniform width from the upper portion of the wall-shaped body 210 to a region where the wall-shaped body is in contact with the substrate 200, or the vertical profile thereof may be formed to have a uniform width from the upper portion to a region where the channel is formed and a gradually widening width downwards from the region. In this manner, the profile of the wall-shaped body 210 may be formed to be linearly or non-linearly widened gradually from the upper portion downwards. In addition, a region ("A" region in FIG. 9) where the wall-shaped body 210 is connected to the substrate 200 may be formed to have a rounded shape, a rectangular shape, an acute shape, or an obtuse shape.

The protective insulating layer (not shown) for protecting the surfaces of the substrate 200 and the wall-shaped body 210 is formed between the surfaces of the substrate and the wall-shaped body and the isolation insulating layer 220, and a thickness thereof is defined in a range of 1 nm to 30 nm. In order to facilitate a process for forming the wall-shaped body 210 protruding over the isolation insulating layer 220, an addition insulating layer (for example, a nitride layer) having different etch ratio may be formed with a thickness of 1 nm to 100 nm on the protective insulating layer. The additional insulating layer may be formed up to the vicinity of the surface of the isolation insulating layer.

A height of the wall-shaped body 210 protruding over the isolation insulating layer 220 is defined in a range of 1 nm to 300 nm. Preferably, in a subsequent process, the width of the protruding wall-shaped body is smaller than the width of the non-protruding wall-shaped body. Preferably, before the tunneling insulating layer 230 is formed, the characteristics of the surface of the wall-shaped body are reformed by performing a surface treatment or chemical process under an ambience of a specific gas (for example, hydrogen, nitrogen, or argon).

The tunneling insulating layer 230 is formed on the surface of the wall-shaped body protruding over the isolation insulating layer 220, and a thickness thereof is defined in a range of 1 nm to 10 nm. The tunneling insulating layer may be formed as a single layer or multiple layers. The multiple layers of the tunneling insulating layer may be formed by using materials having various dielectric constants. For example, the tunneling insulating layer may be formed by using a semiconductor oxide layer, a semiconductor nitride layer ($Si_3N_4$, etc), a metal oxide layer. In addition, the tunneling insulating layer may be formed as multiple layers by using materials having different dielectric constants or band gaps.

The charge storage node 260 is a region capable of storing charges, and a thickness of the layer is formed to be in a range of 0.5 nm to 30 nm. The charge storage node 260 may be formed as a thin-film made of an insulating material capable of storing charges such as a nitride layer and a layer including a metal oxide. Alternatively, the charge storage node may be constructed with nano particles such as nano-sized dots or nano-sized crystals. In addition, the charge storage node may be constructed in a combination of the thin film made of an insulating material and the nano particles. As the nano-sized dots for the charge storage node 260, semiconductors (Si, Ge, etc), various metal oxides (for example, $Hf_2O$, etc), metals (for example, tungsten (W), etc), metal nitrides (for example, WN, TiN, TaN, etc), or silicide materials (for example, $TiSi_2$, $CoSi_2$, etc) may be used. In addition, the charge storage node may be formed by using a material including nano-sized particles of metals or semiconductors in an insulating layer capable of storing charge. For example, the charge storage node may be obtained by forming nano-sized Si dots in $SiO_2$ or $Si_3N_4$ using an excess of Si or by forming nano-sized Ge dots using Ge implantation.

Hereinafter, other embodiments of the aforementioned charge storage device will be described with reference to FIGS. 3 to 5. In another example of the charge storage node of the flash memory device according to the embodiment of the present invention, as shown in FIG. 3, a charge storage node 370 is formed on only the surface of the wall-shaped body protruding over the isolation insulating layer. In still another example of the charge storage node, as shown in FIG. 4, a charge storage node 460 constructed with an insulating layer such as a nitride layer is formed on only the side surface of the tunneling insulating layer 230, but the it is not formed on the surface of the tunneling insulating layer 230 that is formed on the upper portion of the wall-shaped body. In addition, in a further still another example of the charge storage node, as shown in FIG. 5, a charge storage node 570 constructed with nano-sized dots is formed on only the side surface of the tunneling insulating layer 230, but the charge storage node 580 is not formed on the surface of the tunneling insulating layer 230 that is formed on the upper portion of the wall-shaped body. The aforementioned thickness and materials of the charge storage node according to the preferred embodiment is adapted to each charge storage node shown in FIGS. 3 to 5.

The control insulating layer 270 serves to electrically isolate the charge storage node 260 from the control electrode 240, and a thickness of the layer is defined in a range of 2 nm to 30 nm. The control insulating layer 270 may be formed with a single insulating layer made of various materials such as $SiO_2$ or $Al_2O_3$ or two or more layers having different dielectric constants or band gaps.

A thickness of the control electrode 240 is defined in a range of 1 nm to 900 nm, and the control electrode 240 may be construction with a single layer or multiple layers by using conductive materials having different work functions. The control electrode 240 may be made of highly doped p-type or n-type Si, poly Si, Ge, poly Ge, SiGe, ploy, SiGe, amorphous Si, amorphous Ge, amorphous SiGe, and the like. Alternatively, the control electrode may be made of a metal nitride such as WN, TaN, or TiN. In addition, the control electrode may be made of metals (for example, W, etc) having various work functions. In addition, the control electrode may be made of various silicide materials (for example, NiSi, etc). In addition, the aforementioned combination of two or more conductive layers may be used for the control electrode.

In (a) and (b) of FIG. 2, reference numeral d1 denote an interval between adjacent control electrodes 240, that is, a pitch of control electrodes. The interval d1 is suitably defined in a range of 1 nm to 200 nm.

In (b) of FIG. 2, the width of the control electrode 240 intersecting the wall-shaped body 210 is formed to be substantially equal to the interval between the control electrodes (that is, the pitch of control electrodes), which may be slightly different from each other according to processes or applications.

The tunneling insulating layer 230 is formed with a substantially uniform thickness on the side surfaces and upper surface of the wall-shaped body 210 or with different thickness in some cases. For example, the thickness of the tunneling insulating layer formed on the upper surface of the wall-shaped body may be formed to be larger than that of the tunneling insulating layer formed on the side surfaces thereof. The thickness of the tunneling insulating layer formed on the upper surface may be defined in a range of 1 nm to 40 nm.

In (a) of FIG. 2, a region "D" denotes a region of an inversion layer that is induced by a fringing field of the control electrode. That is, the memory device can be operated as the flash cell device due to the inversion layer that is generated by the fringing field of the control electrode 40 in some cases.

In the structure of the cell device according to the preferred embodiment of the present invention shown in FIG. 2, since the width of the wall-shaped body 210 is small in most cases, complete depletion occurs in a region when the channel is generated, so that a threshold voltage is about 0V. It is may be advantageously functioned in NAND flash operations. Although channel doping may be formed in a halo shape so as to reduce the short channel effect of the cell device, sufficient depletion occurs due to narrow width of the body, so that the threshold voltage is lowered in comparison with an existing planar channel cell device. It is may be advantageously functioned in NAND flash operations.

MODE FOR INVENTION

First Embodiment

Figure 6A:
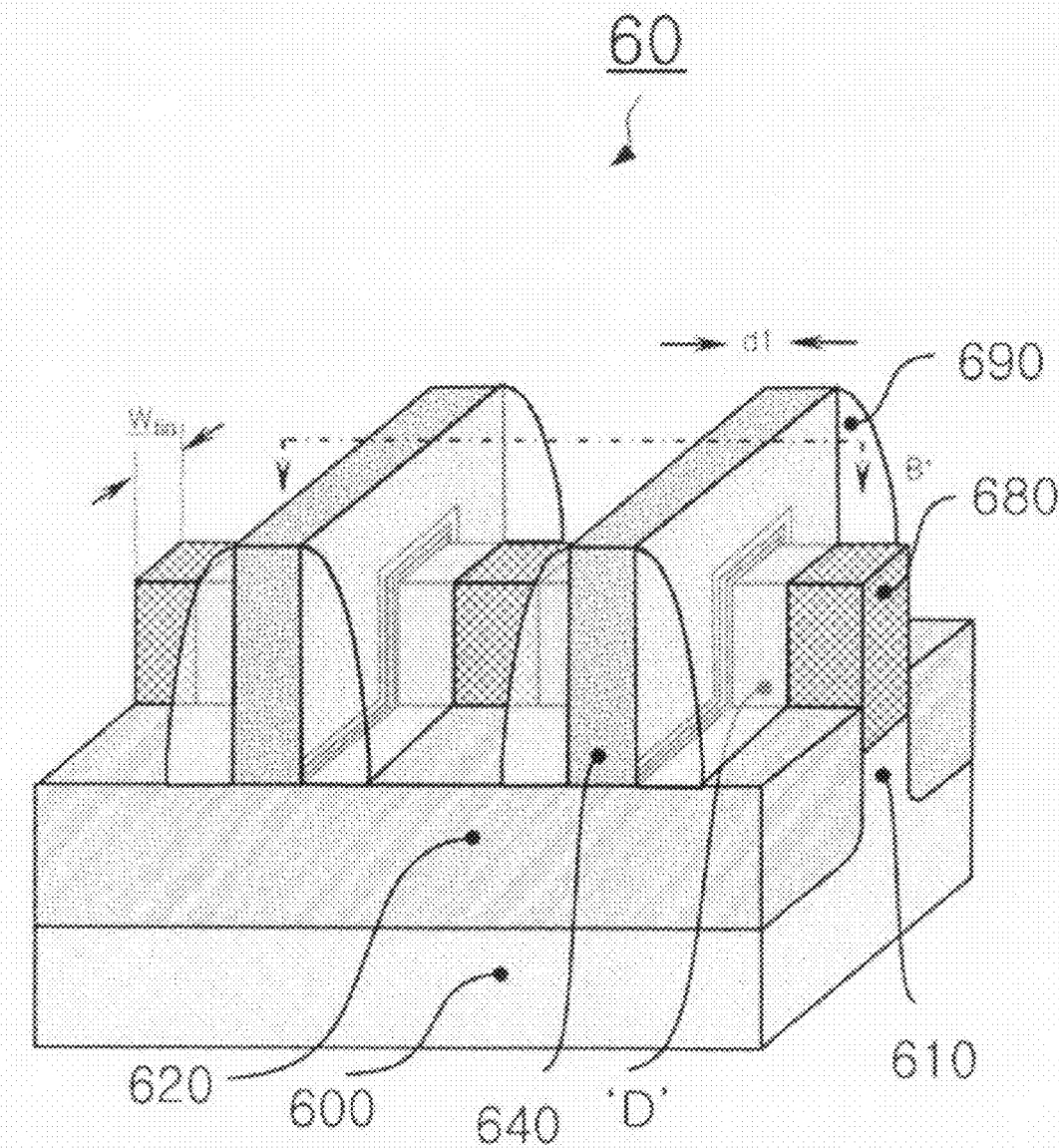
FIG. 6 illustrates views of a flash memory device according to a first embodiment of the present invention, in which (a) is a three-dimensional perspective view, (b) is a plan view thereof, (c) is a cross-sectional view taken along line B-B', and (d) is a cross-sectional view illustrating a structure that a space between spacers in (c) is filled with insulating materials having different dielectric constants and an insulating material is formed thereon.
Figure 6C:
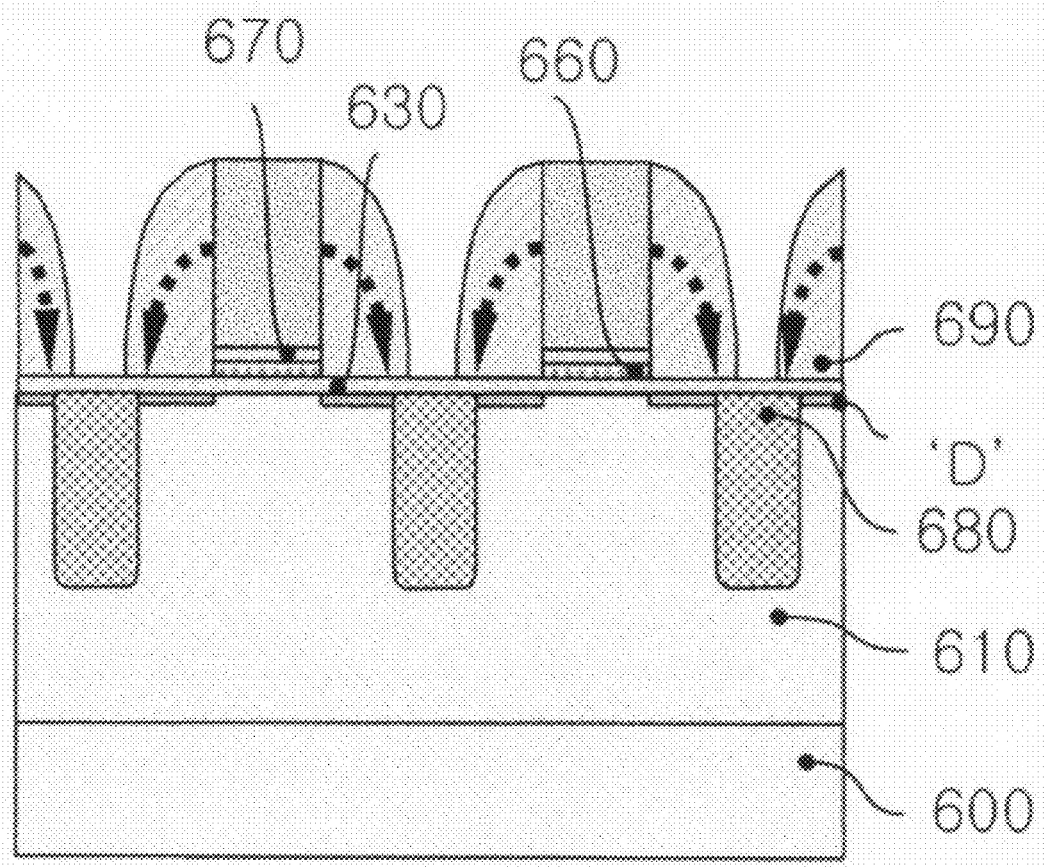
Figure 6D:
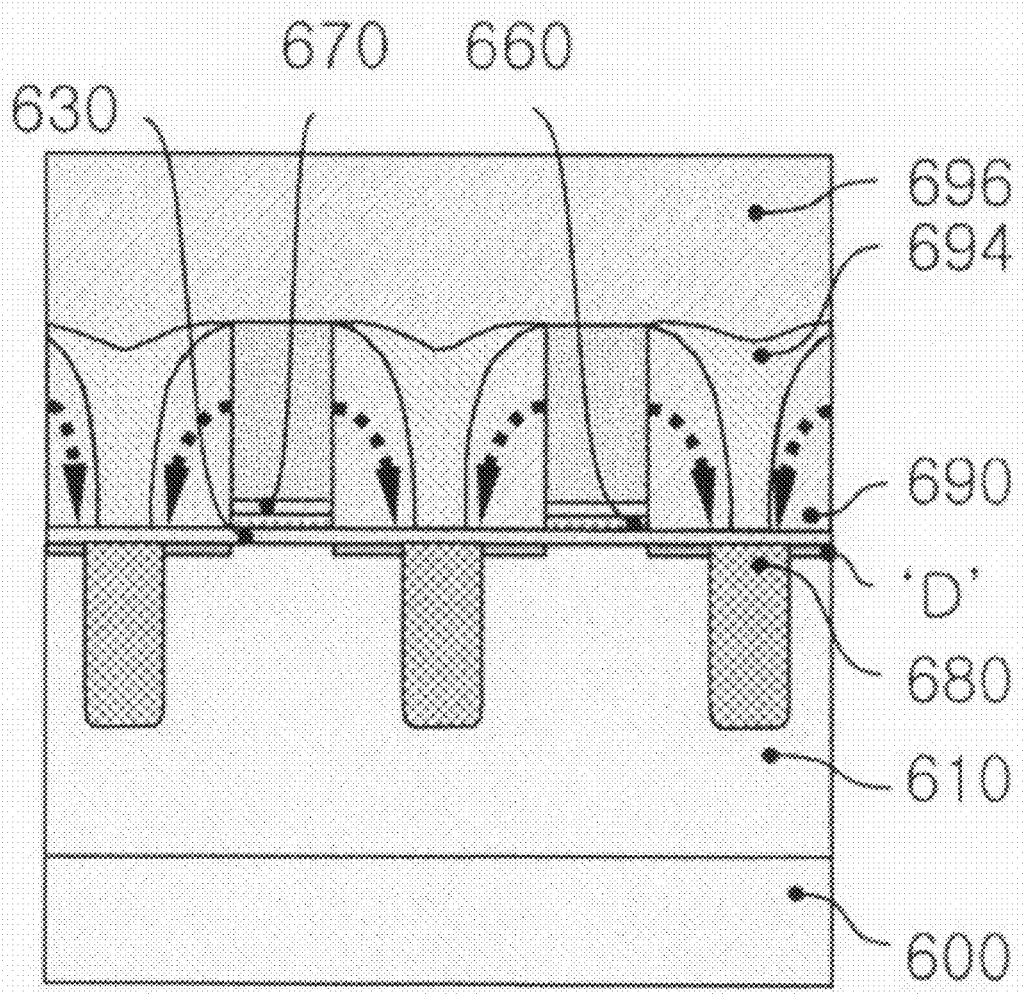

Now, a NAND flash memory device according to a first embodiment of the present invention will be described in detail with reference to FIG. 6. The memory device according to the first embodiment of the present invention is characterized in that source/drain regions are separated by a predetermined distance from control electrodes so as for the source/drain regions not to be overlapped with the control electrode. In FIG. 6, (a) is a perspective view illustrating a portion of a cell string of the NAND flash memory, that is, the memory device according to the first embodiment of the present invention, in which two devices are provided to the cell string, that is, in which two word lines are provided. In FIG. 6, (b) is a plan view of (a) of FIG. 6, (c) is a cross-sectional view taken along line B-B', and (c) is a cross-sectional view taken along line A-A'. Referring to FIG. 6, the flash memory device 60 according to the first embodiment of the present invention includes a bulk silicon substrate 600, a wall-shaped body 610, an isolation insulating layer 620, a tunneling insulating layer 630, a control electrode 640, a charge storage node 660, a control insulating layer 670, source/drain regions 680, and spacers 690. In the first embodiment, description of the same components as those of the aforementioned construction will be omitted for the convenience of description. In the construction of the flash memory device 60, the wall-shaped body 610 is formed to be connected to the substrate 600 on the bulk silicon substrate 600; a protective insulating layer (not shown) is formed on surfaces of the substrate 600 and the wall-shaped body 610; the isolation insulating layer 620 for device isolation is formed on the protective insulating layer up to the vicinity of the surface of the wall-shaped body 610; an upper portion and side surfaces of the wall-shaped body 610 are exposed by etching the protective insulating layer and the isolation insulating layer 620 by a predetermined depth from the upper surface of the wall-shaped body 610; the tunneling insulating layer 630 is formed on the exposed upper portion and side surfaces of the wall-shaped body 610; the charge storage node 660 and the control insulating layer 670 are sequentially formed on the tunneling insulating layer 630; and the control electrode 640 is formed thereon.

The source/drain regions 680 are formed not to be overlapped with the control electrode 640. The spacers 690 are used so as for the source/drain regions 680 not to be overlapped with the control electrode 640. The spacers 690 are formed on both sides of the control electrode 640. Widths of the spacers 690 relate to a separation distance D between the control electrode 640 and the source/drain regions 680. As the separation distance d1 increases, the widths increase. The widths of the spacers 690 are suitably defined to be 1 nm or more.

Depths of junctions for forming the source/drain regions 680 are preferably defined in a range of 50 nm upwards from the surface of the isolation insulating layer 620 and in a range of 50 nm downwards from the surface thereof.

The separation distances d1 between the control electrode 640 and the source/drain regions 680 shown in FIG. 6 are defined to be at least 0.1 nm or more, preferably, in a range of less than 0.5 times an interval between the control electrodes 640. If the separation distance d1 is 0.5 times the pitch of the adjacent control electrodes 640, the source/drain regions disappear. In this case, a general MOS device cannot be operated. However, the cell string of the NANA flash memory device constructed as a nano-sized cell device can be operated.

In a fabricating process, when the source/drain regions are to be formed through an ion implantation process after the formation of the spacers 690, the source/drain regions cannot be formed in the state that the spaces between the control electrodes are entirely filled with the spacers. In the figure, the source/drain regions are formed to be in contact with ends of the spacers. However, according to an actual process, the source/drain regions may be formed to be partially overlapped with the spacers.

In FIG. 6, (c) is a cross-sectional view taken along line B-B' of (a) of FIG. 6, in which a fringing field generated from the control electrode is indicated by dashed-line arrows. In the first embodiment, the charge storage node 660 may be constructed as an insulating layer such as a nitride layer.

The spacers 690 are made of an insulating material. By increasing a dielectric constant of the insulating material, an inversion layer can be easily formed. In FIG. 6, (d) is a cross-sectional view illustrating that a first insulating material layer 694 having a predetermined dielectric constant is formed between the spacers 690, and a second insulating material layer 696 having a different dielectric constant is formed on the first insulating material layer 694. If the source/ drain regions 680 are not formed and if the dielectric constant of the first insulating material layer 694 is high, the inversion layer generated by the fringing field of the control electrode can be easily formed under the first insulating material layer 694. Due to the additional insulating layers having different dielectric constants, a freedom of formation of the inversion layer can be increased.

On the resulting product, a contact (not shown) and an interconnection layer (not shown) are formed on a device in a region excluding an additional insulating layer (not shown) having a predetermined thickness and the cell device region. In the NAND flash memory device having the aforementioned structure according to the embodiment, the source/drain regions are formed not to be overlapped with the control electrode, so that a distance between the source region and the drain region in one cell device can be larger than a length of the control electrode. Accordingly, the short channel effect caused from a short distance between the source and the drain can be suppressed. If the source and drain are formed to be overlapped with the control electrode by using the existing method, a distance between the source and drain is smaller than the length of the control electrode, so that the short channel effect may relatively easily occur. As a result, the short channel effect due to the miniaturization of device can be suppressed, so that the miniaturization characteristics can be improved. In this manner, the cell device can be effectively operated in the operations of the NAND flash memory.

In the NAND flash memory device, a cell array is constructed with multiple cell strings, and each cell string includes multiple cell devices. The memory device according to the embodiment is also operated as a cell device. The cell string is constructed with plurality of cell devices connected in a string shape and first and second switching devices disposed at respective ends of the string. Each of the first and second switching devices basically includes source/drain regions and a gate electrode. A source or drain region disposed at the side that is connected to the cell device may be formed not to be overlapped with the gate electrode of the first and second switching devices. In addition, similarly to the cell device, a source or drain region of the first and second switching devices disposed at the side that is not connected to the cell device may be formed not to be overlapped with the control electrode (or the gate electrode) or to be overlapped with the gate electrode. It is preferable that resistance is reduced by increasing a concentration of the source/drain regions formed in a region where the cell device is excluded.

In the memory device according to the embodiment, an inversion layer (a region 'D' in FIG. 6) is generated by a fringing field induced from the control electrode, so that the memory device can be operated as the flash cell device due to the inversion layer In FIGS. 7, (a) and (b) are cross-sectional views for explaining another example of the charge storage node according to the first memory device. As shown in (a) and (b) of FIG. 7, another example of the charge storage node according to the embodiment is a charge storage node 770 constructed with nano-sized dots.

Figure 8A:
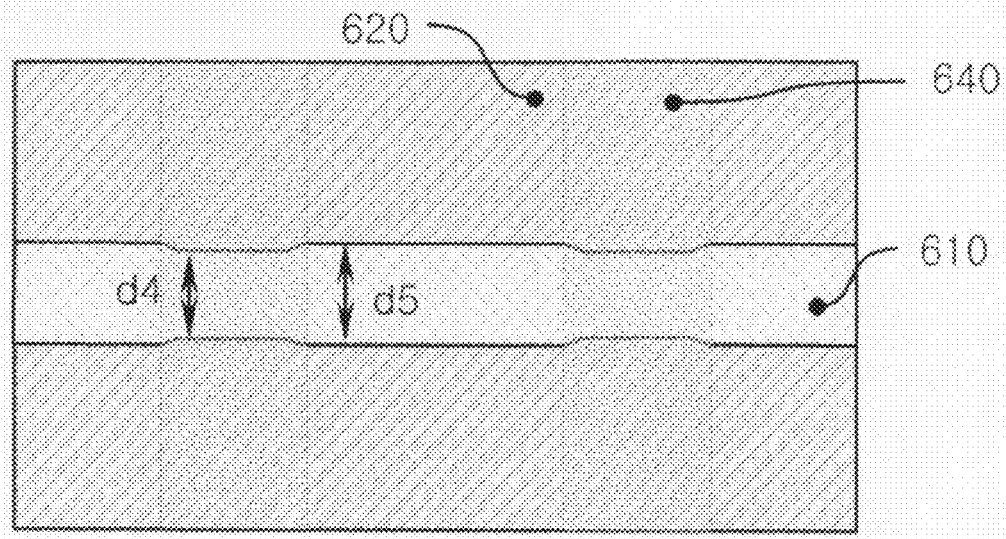
FIG. 8 illustrates plan views for explaining modified examples of widths of wall-shaped bodies in a flash memory device according to the present invention, in which (a) is a plan view illustrating a flash memory device in which a width of a wall-shaped body intersecting a control electrode is smaller than a width of a wall-shaped body not intersecting the control electrode, and (b) is a plan view illustrating a flash memory device in which a width of a wall-shaped body intersecting a control electrode is larger than a width of a wall-shaped body not intersecting the control electrode
Figure 8B:
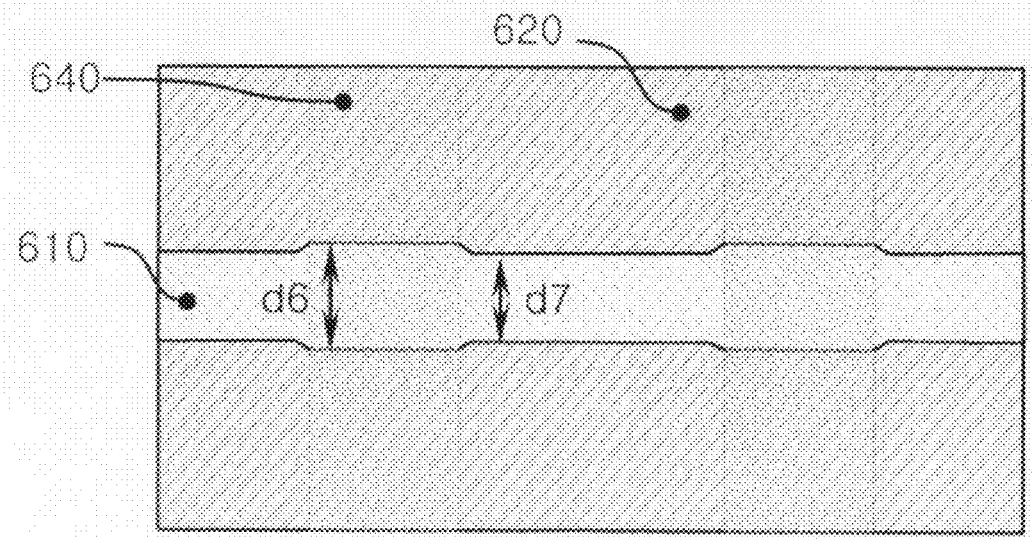

In FIGS. 8, (a) and (b) are plan views illustrating that a width of the wall-shaped body in a region which is intersected by a control electrode is different from a width of the wall-shaped body in a region which is not intersected by the control electrode in the flash memory device. Firstly, in the device shown in (a) of FIG. 8, a width d5 of the wall-shaped body in the region which is not intersected by the control electrode is formed to be larger than a width d4 of the wall-shaped body in the region which is intersected by the control electrode. Secondly, in the device shown in (b) of FIG. 8, a width d7 of the wall-shaped body in the region which is not intersected by the control electrode is formed to be smaller than a width d6 of the wall-shaped body in the region which is intersected by the control electrode.

The structure may be formed by performing selective epitaxial layer growth or etching in only the source/drain region or be formed according to processes for forming the control electrode. For example, in a state that a region in which the control electrode is to be formed is exposed, the wall-shaped body is slightly oxidized, and subsequent suitable processes are performed to form the control electrode, so that the shape shown in (a) of FIG. 8 may be obtained. On the contrary, if an oxidizing process is performed in a state that the control electrode is formed so as to oxidize the wall-shaped body which is not intersected by the control electrode, the width of the wall-shaped body is reduced, so that the shape shown in (b) of FIG. 8 may be obtained. As shown in (a) of FIG. 8, since channel doping can be selectively performed in the state that the region where the control electrode is to be formed, the region of the wall-shaped body that is not intersected by the control electrode is doped with a slightly low concentration, so that the inversion layer can be easily induced by the fringing field. In addition, as shown in (a) of FIG. 8, the width of the wall-shaped body that is intersected by the control electrode is formed to be relatively small, so that the short channel effect can be further suppressed. As shown (b) of FIG. 8, if the width of the wall-shaped body that is not intersected by the control electrode is reduced, the inversion layer can be easily induced by the fringing layer.

Figure 9A:
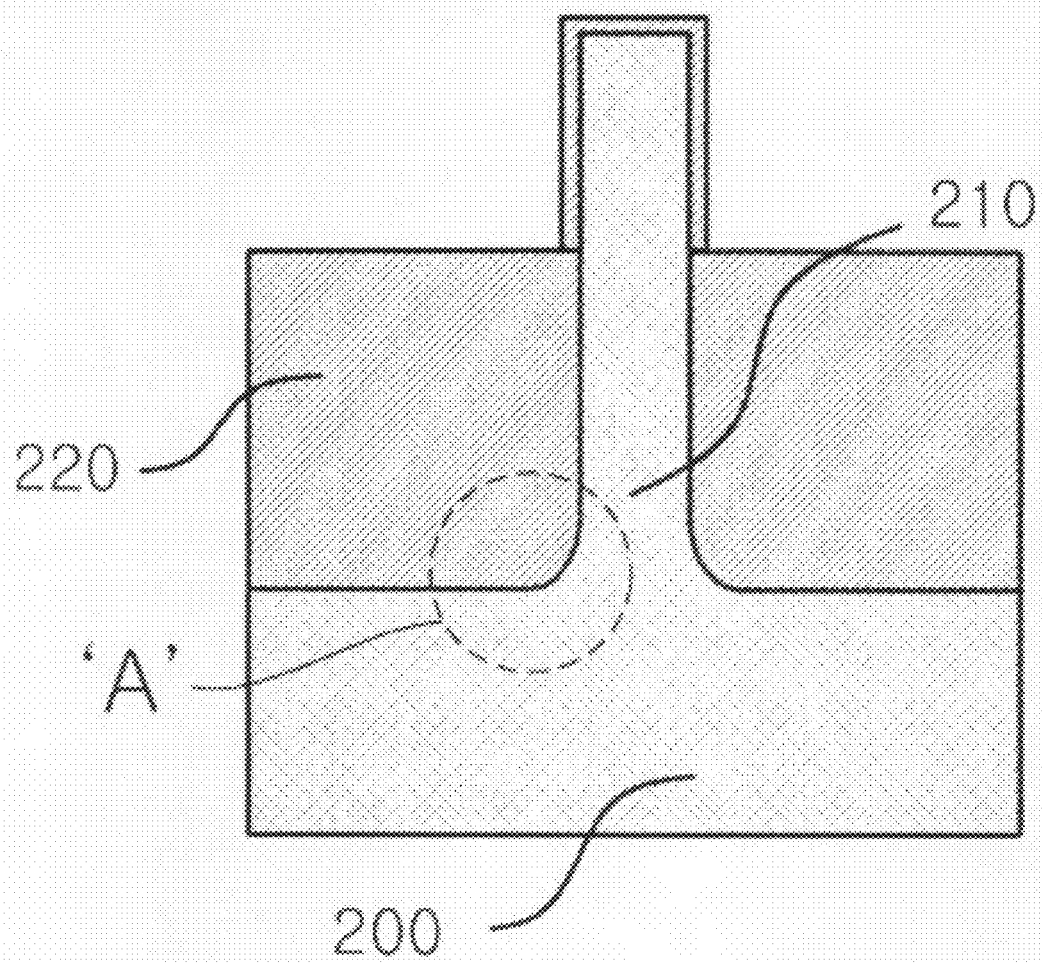
FIG. 9 illustrates cross-sectional views of a flash memory device according to the present invention, taken along a control electrode intersecting a wall-shaped body so as to explain various profiles of the wall-shaped body and shapes of a top portion and corners.
Figure 9D:
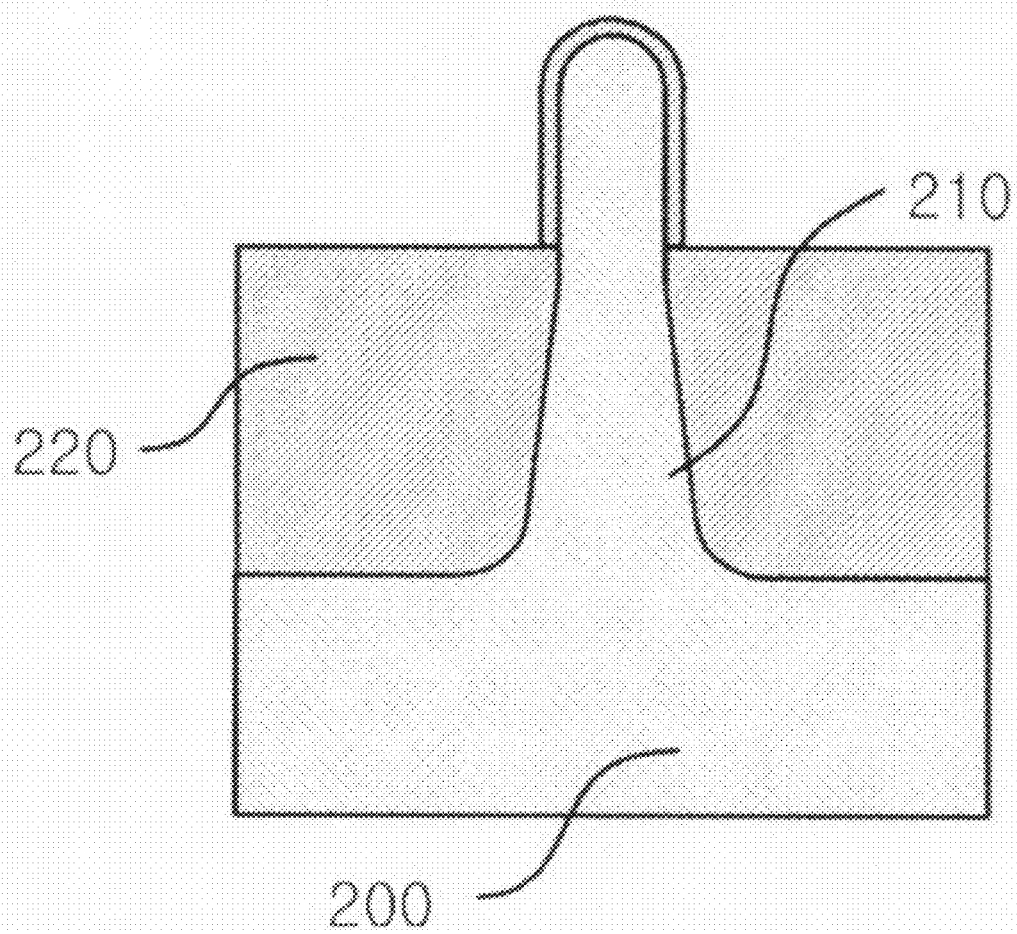

In FIG. 9, (a) to (d) are cross-sectional views illustrating examples of the vertical profile of the wall-shaped body 210 and the shapes of the upper portion and corners of the wall-shaped body of the memory device 210 according to the present invention. In (a) of FIG. 9, the width of the wall-shaped body 210 is maintained to be substantially uniform from the upper portion to a region where the wall-shaped body is in contact with the substrate 200, and the upper corner is formed to have a substantially rectangular shape. In (b) of FIG. 9, a profile similar to that of (a) of FIG. 9 is illustrated, but the upper portion is formed to have a rounded shape. In (c) of FIG. 9, the upper portion of the wall-shaped body is formed to have a rounded shape, and the width of the wall-shaped body is gradually increased from the upper portion to the substrate. In this case, a resistance of the wall-shaped body can be effectively reduced. In (d) of FIG. 9, the upper portion of the wall-shaped body is formed to have a rounded shape, and the width of the wall-shaped body is maintained to be uniform from the upper portion to the surface of the isolation insulating layer 220 and gradually increased downwards therefrom. In this case, the effect of (c) of FIG. 9 can be obtained. In the cases of (c) and (d) of FIG. 9, the width of the wall-shaped body is linearly increased toward the substrate. However, the width of the wall-shaped body may be nonlinearly increased according to the processes. In the whole profile of the wall-shaped body, the region (region "A") where the wall-shaped body 210 is in contact with the substrate 200 may be formed to have a rounded shape. Now, a method of fabricating the memory device according to the first embodiment of the present invention will be described with reference to FIGS. 10 and 11. FIG. 10 is a flowchart for sequentially explaining processes of the method, and FIG. 11 illustrates cross-sectional views for the processes.

Figure 11A:
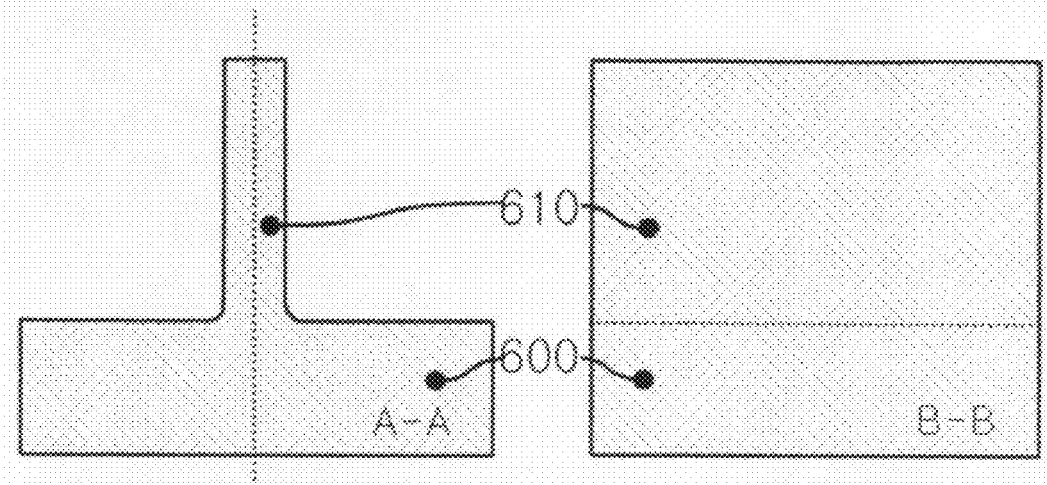
FIG. 11 illustrates cross-sectional views of resulting products formed in the fabricating method of FIG. 10.
Figure 11B:
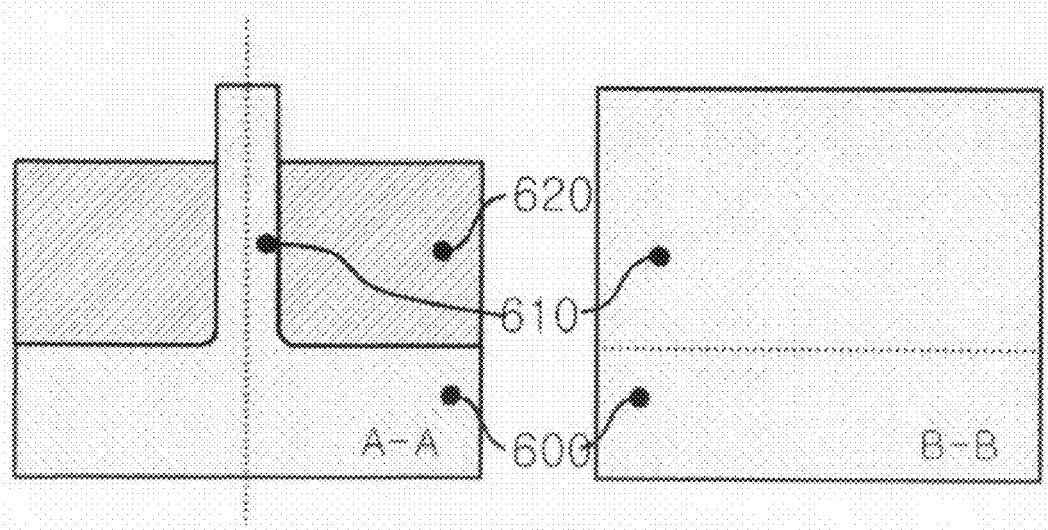
Figure 11C:
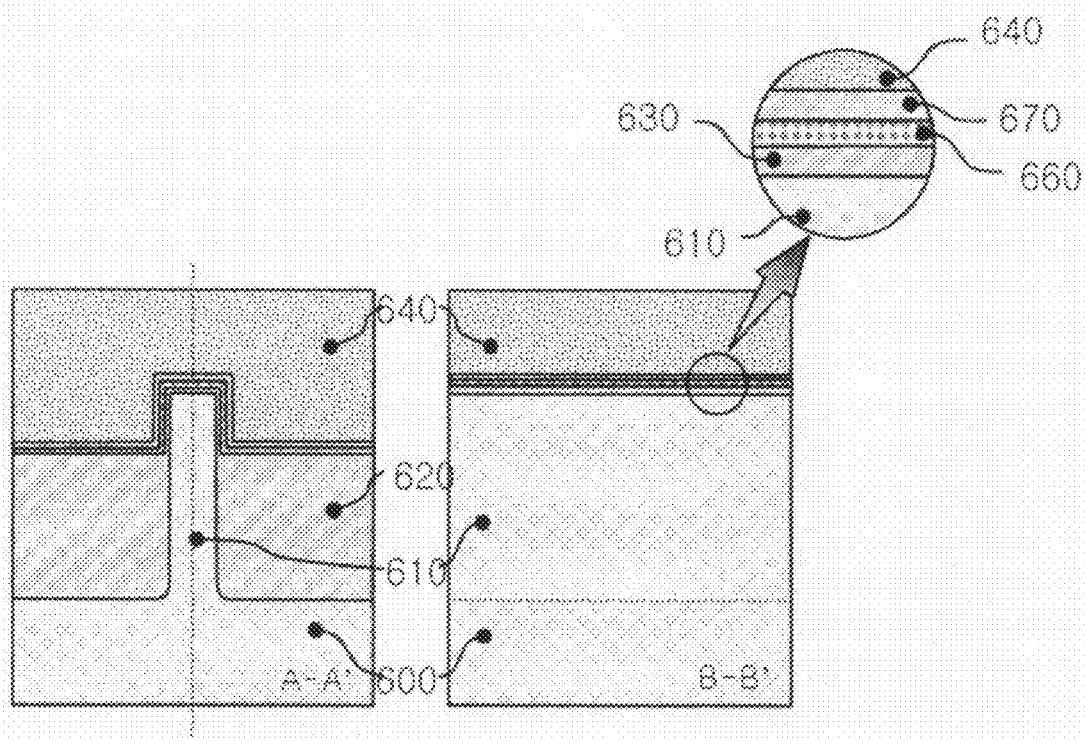

FIG. 11, (a) to (d) illustrate main processes for forming a cell structure according to the present invention. In order to clarify the processes, cross sections taken along lines A-A' and B-B' of the structure of (a) of FIG. 6 are illustrated in correspondence to the processes.

Firstly, referring to (a) of FIG. 11, the wall-shaped body 610 is formed on the silicon substrate 600. In FIG. 11, (a) is a cross-sectional view after the wall-shaped body 610 is formed. In order to form the wall-shaped body 610 (Step 900 of FIG. 10), an insulating layer is formed on the silicon substrate 600; a photoresist PR for defining the wall-shaped body 610 is formed; the insulating layer and the silicon substrate are anisotropic-etched; and the insulating layer and the PR are removed, so that the wall-shaped body 610 can be obtained. Alternatively, after the PR pattern is formed, only the insulating layer is anisotropic-etched, and the PR is removed. Next, the silicon substrate is anisotropic-etched by using the insulating layer as a hard mask, so that the wall-shaped body 610 can be obtained. In addition, alternatively, the profile of the wall-shaped body can be formed by using only the PR pattern without use of a hard mask. The insulating layer used as a hard mask in the process for forming the wall-shaped body is not completely removed but remained, so that the thickness of the tunneling insulating layer formed on the upper portion of the wall-shaped body can be increased.

In order to reduce or avoid damage to the exposed silicon surface in the resulting product due to anisotropic etching, annealing under an ambience of a specific gas, surface treatment such as oxidation and oxide-layer removing, or surface treatment using chemical rinsing may be performed. In addition, in order to form the upper portion of the wall-shaped body in a rounded shape, annealing under an ambience of hydrogen or high-temperature oxidation and etching may be performed.

Next, as shown in (b) of FIG. 11, the isolation insulating layer 620 is formed (Step 910 of FIG. 10). Firstly, in a state that the silicon surface is exposed, a protective insulating layer such as a thermal oxide layer for protecting the surface is formed with a small thickness, and the isolation insulating layer 620 is formed thereon with a thickness larger than the height of the wall-shaped body 610. The isolation insulating layer is planarized down to the vicinity of the upper surface of the wall-shaped body by using CMP or the like, and the planarized isolation insulating layer is etched vertically down to a predetermined depth so as for the wall-shaped body to protrude, so that the isolation insulating layer shown in (b) of FIG. 11 can be formed.

A method for exposing a portion of the wall-shaped body by etching the planarized isolation insulating layer down to a predetermined depth can be performed as follows. A nitride layer ($Si_3N_4$) having an etch ratio with respect to an isolation insulating layer is formed on the protective insulating layer for protecting the surface, and the isolation insulating layer for device isolation is formed thereon. After that, in a similar manner, planarization is performed down to the surface of the nitride layer disposed on the upper portion of the wall-shaped body, and the isolation insulating layer is vertically etched down to a predetermined depth. The exposed nitride layer is selectively etched.

Next, as shown in (c) of FIG. 11, in order to improve surface characteristics of the wall-shaped body exposed to protrude over the isolation insulating layer, the tunneling insulating layer 630, the charge storage node 660, and the control insulating layer 670 are sequentially formed (Step 920 of FIG. 10). Next, the control electrode 640 is formed thereon (Step 930 of FIG. 10).

Next, as shown in (d) of FIG. 11, photoresist (PR) for forming the control electrode is formed, and the control electrode 640 is formed by using anisotropic etching (Step 930 of FIG. 10). After the control electrode is formed, the exposed control insulating layer 670 is anisotropic-etched, and the exposed charge storage node 660 is removed. The exposed tunneling insulating layer 630 may be removed or partially remained according to the processes. Next, the spacer 690 made of an insulating material is formed (940 of FIG. 10), and ion implantation is performed so as to form the source/drain regions 680 (950 of FIG. 10). At this time, if a space between the control electrodes is completed filled by adjusting the width of the spacer and if ion implantation for forming the source or drain region of the MOS device disposed in peripheral circuits and the switching device disposed at both ends of the cell string is performed, the source/drain regions are not formed in the cell device of the cell string. In this manner, the separation distance (that is, a non-overlapped length) between the source/drain regions and the control electrode formed by adjusting the width of the spacer can be controlled, and the source/drain regions are not allowed to be formed between the control electrodes of the cell device. In order not to form the source/drain regions in the cell device but to form the source/drain regions in the MOS device, an additional mask needs to be used.

In order to suppress the short channel effect in the cell device, suitable channel doping needs to be performed. The ion implantation for the channel doping may be performed before or just after the step shown in (a) of FIG. 11 or after the planarization process for implementing the structure shown in (b) of FIG. 11. Alternatively, after the control electrode is formed, body doping may be performed in a halo shape by using tilt ion implantation. The halo doping may be performed together with the channel doping that is performed in advance. Now, another embodiment of the method of fabricating the memory device of the present invention will be described with reference to FIG. 12.

Firstly, a wall-shaped body is formed on a semiconductor substrate (Step 1200). After the formation of the wall-shaped body, in order to reduce or avoid damage to the exposed surface of the semiconductor substrate due to anisotropic etching, annealing under an ambience of a specific gas, oxidation, or oxide-layer removing may be performed. In addition, in order to form the upper portion of the wall-shaped body in a rounded shape, annealing under an ambience of hydrogen or high-temperature oxidation and etching may be performed. In a state that the silicon substrate is exposed, an insulating layer such as a thermal oxide layer for protecting the surface is formed with a small thickness, and the isolation insulating layer for device isolation is formed thereon with a thickness larger than the height of the wall-shaped body (Step 1210). In a state that a thickness of 10 nm to 500 nm is remained on the upper surface of the wall-shaped body, planarization may be performed by using CMP. Alternatively, the isolation insulating layer is planarized down to the vicinity of the upper surface of the wall-shaped body, and an additional insulating layer made of a material the same as or different from that of the isolation insulating layer is formed with a thickness of 10 nm to 500 nm.

Photolithography for defining a region where the control electrode is to be formed is performed, so that a height of the wall-shaped body in the only region that is defined by partially etching the additional insulating layer and the isolation insulating layer is in a range of 1 nm to 300 nm. In order to suppress the short channel effect in the cell device, suitable channel doping needs to be performed. In this case, the channel doping may be selectively performed. In addition, the ion implantation for the channel doping may be performed before or just after the wall-shaped body is formed. Alternatively, the ion implantation may be performed after the planarization process.

In order to improve the surface characteristics of the exposed wall-shaped body, annealing under an ambience of a specific gas, surface treatment such as oxidation and oxide-layer removing, or surface treatment using chemical rinsing may be performed. In addition, in order to form the upper portion of the wall-shaped body in a rounded shape, annealing under an ambience of hydrogen or high-temperature oxidation and etching may be performed.

The tunneling insulating layer is formed on the surface of the wall-shaped body that is subject to the surface treatment, the charge storage node for storing charges is formed thereon, and the control insulating layer for electrical insulation between the charge storage node and the control electrode is formed (Step 1220). Next, the control electrode is formed by using a damascene process (Step 1230). In this case, the process for forming the source/drain is performed in two methods.

In the first method ("A" of FIG. 12), the charge storage node and the control insulating layer existing in a region excluding the surface of the control electrode formed in an etched groove are removed, a portion where the devices in which the source/drain need to be formed are disposed is selectively exposed in a region excluding the cell device region, the additional insulating layer and the isolation insulating layer are removed down to the vicinity of the bottom of the control electrode formed on the isolation insulating layer, and the ion implantation for forming the source/drain is performed. As a result, the source/drain regions are not formed in the cell device, and the source/drain regions are normally formed in the switching device or the MOS device disposed in the peripheral circuit (Step 1260).

In the second method ("B" of FIG. 12), the charge storage node and the control insulating layer existing in the region excluding the surface of the control electrode formed in the etched groove are removed, and the underlying additional insulating layer and isolation insulating layer are etched (Step 1240). At this time, the etching is performed down to the vicinity of the bottom of the control electrode that is in contact with the isolation insulating layer, and the charge storage node and the control insulating layer exposed in the side surface of the control electrode are removed. As the channel doping for suppressing the short channel effect, body doping may be performed in a holo shape by using tilt ion implantation after the control electrode is formed. The halo doping may be preformed together with the channel doping that is performed in advance. Next, the spacer made of an insulating layer is formed (Step 1250), and the ion implantation is performed, so that the source/drain regions that is not overlapped with the control electrode can be formed in the cell device (Step 1260).

In addition, similarly to the cell device, a gate insulating layer of the switching device of the cell string of the NAND flash memory may be constructed with a tunneling insulating layer, a charge storage layer, and a control insulating layer. Alternatively, the gate insulating layer may be formed by using any one of the tunneling insulating layer and the control insulating layer of the cell device or both insulating layers. In addition, the gate insulating layer may be formed as a single layer formed in an individual process or two or more insulating layers.

INDUSTRIAL APPLICABILITY

A device technology according to the present invention can be widely used for a flash memory device.

The invention claimed is:
1. A flash memory device comprising:
a semiconductor substrate;
a first wall-shaped body connected to the semiconductor substrate and protruding from the semiconductor substrate in a wall shape;
an isolation insulating layer made of an insulating material and formed between the first wall-shaped body and a second wall-shaped body adjacent to the first wall-shaped body so as to electrically isolate devices which are to be formed in the first wall-shaped body and the second wall-shaped body;
an interlayer insulating layer formed on an exposed upper surface and side walls of the first wall-shaped body which are exposed by etching the isolation insulating layer by a predetermined depth from the upper surface of the first wall-shaped body; and
a control electrode formed on the interlayer insulating layer in a direction perpendicular to the first wall-shaped body,
wherein the interlayer insulating layer comprises:
a tunneling insulating layer formed on the exposed upper surface and side walls of the first wall-shaped body;
a charge storage node formed on the tunneling insulating layer to store charges;
a control insulating layer formed on the charge storage node,
wherein the control insulating layer is formed between the charge storage node and the control electrode, and
wherein the flash memory device includes neither a source nor a drain, and is operated as a cell device by a fringing field generated by a voltage applied to the control electrode.

2. The flash memory device according to claim 1, further comprising a protective insulating layer on a surface of the semiconductor substrate and the surface of the first wall-shaped body,
wherein the interlayer insulating layer is formed on the exposed upper surface and side walls of the first wall-shaped body obtained by etching the protective insulating layer and the isolation insulating layer from the upper surface of the first wall-shaped body down to a predetermined depth.

3. The flash memory device according to claim 2, further comprising a nitride layer formed on the protective insulating layer, and
wherein the interlayer insulating layer is formed on the exposed upper surface and side walls exposed by etching the protective insulating layer, the nitride layer, and the isolation insulating layer by a predetermined depth from the upper surface of the first wall-shaped body.

4. The flash memory device according to claim 1,
wherein a height of the first wall-shaped body protruding over the isolation insulating layer is defined in a range of 1 nm to 300 nm, and
wherein a width of the first wall-shaped body protruding over the isolation insulating layer is formed to be entirely smaller than a width of the first wall-shaped body that does not protrude over the isolation insulating layer.

5. The flash memory device according to claim 1, wherein the tunneling insulating layer is formed as a single layer or multiple layers, and
wherein, in a case where the tunneling insulating layer is formed as the multiple layers, a plurality of materials having different dielectric constants and band gaps are used.

6. The flash memory device according to claim 1, wherein a channel is formed in the first wall-shaped body by performing channel doping in a halo shape, thereby minimizing a short channel effect.

7. A flash memory cell string comprising:
   a plurality of cell devices sequentially connected to each other; and
   first and second switching devices disposed at both ends of the cell string,
   wherein each of the cell devices comprises:
   a semiconductor substrate;
   a first wall-shaped body connected to the semiconductor substrate and protruding from the semiconductor substrate in a wall shape;
   an isolation insulating layer made of an insulating material and formed between the first wall-shaped body and a second wall-shaped body adjacent to the first wall-shaped body so as to electrically isolate devices which are to be formed in the first wall-shaped body and the second adjacent wall-shaped body;
   an interlayer insulating layer made of an insulating material and formed on an exposed upper surface and side walls of the first wall-shaped body which are exposed by etching the isolation insulating layer by a predetermined depth from an upper surface of the first wall-shaped body; and
   a control electrode formed on the interlayer insulating layer in a direction perpendicular to the first wall-shaped body, and
   wherein the flash memory device includes neither a source nor a drain, and is operated as a cell device by a fringing field generated by a voltage applied to the control electrode.

8. The flash memory cell string according to claim 7, wherein each of the first and second switching devices includes both or any one of source and drain regions, and
   wherein in a case where each of the first and second switching devices includes any one of the source and drain regions, the first switching device includes only the drain region formed in a side of the first switching device which the side is not connected to cell devices, and the second switching device includes only the source region is formed in a side of the second switching device which the side is not connected to cell devices.

* * * * *